(12) United States Patent
Lee et al.

(10) Patent No.: US 12,103,284 B2
(45) Date of Patent: Oct. 1, 2024

(54) DISPLAY DEVICE

(71) Applicant: SAMSUNG DISPLAY CO., LTD., Yongin-si (KR)

(72) Inventors: Dong Eun Lee, Asan-si (KR); Do Hyung Ryu, Yongin-si (KR); Hyun Sang Park, Gunpo-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 385 days.

(21) Appl. No.: 17/315,323

(22) Filed: May 9, 2021

(65) Prior Publication Data

US 2022/0063233 A1 Mar. 3, 2022

(30) Foreign Application Priority Data

Sep. 2, 2020 (KR) .................. 10-2020-0111508

(51) Int. Cl.
*B32B 3/08* (2006.01)
*B32B 27/08* (2006.01)

(52) U.S. Cl.
CPC .............. *B32B 3/085* (2013.01); *B32B 27/08* (2013.01); *B32B 2457/20* (2013.01)

(58) Field of Classification Search
CPC ............. H01L 27/3276; H01L 51/5237; H01L 51/0097; H01L 2251/5338; B32B 3/085; B32B 27/08; B32B 2457/20
See application file for complete search history.

(56) References Cited

U.S. PATENT DOCUMENTS

| 9,256,250 | B2 | 2/2016 | Raff et al. | |
| 10,229,963 | B1* | 3/2019 | Qi | H10K 59/131 |
| 2017/0338294 | A1* | 11/2017 | Choi | H10K 59/87 |
| 2022/0344615 | A1* | 10/2022 | Li | H10K 50/84 |

FOREIGN PATENT DOCUMENTS

| CN | 110764302 | 2/2020 |
| CN | 111063262 | 4/2020 |
| CN | 111128020 | 5/2020 |
| KR | 10-2020-0049321 | 5/2020 |

OTHER PUBLICATIONS

Extended European Search Report Dated Jan. 26, 2022 For European Application Serial No. 21191578.0-1211.

* cited by examiner

*Primary Examiner* — Alicia J Weydemeyer
*Assistant Examiner* — Laura B Figg
(74) *Attorney, Agent, or Firm* — F. CHAU & ASSOCIATES, LLC

(57) ABSTRACT

A display device includes a display panel that is bent so that at least a portion of the display panel overlaps another portion of the display panel; and a spacer surrounded by the display panel and that includes a flat portion and a bent portion connected to the flat portion, where an upper surface of the bent portion has a first curvature and a lower surface of the bent portion has a second curvature that differs from the first curvature.

24 Claims, 13 Drawing Sheets

MDRa: MDR_Fa, MDR_Ca

DISPLAY DEVICE

This application claims priority under 35 U.S.C. § 119 from Korean Patent Application No. 10-2020-0111508, filed on Sep. 2, 2020 in the Korean Intellectual Property Office, the contents of which are herein incorporated by reference in their entirety.

TECHNICAL FIELD

Embodiments of the present disclosure are directed to a display device.

DISCUSSION OF THE RELATED ART

A display device displays an image and includes one of various types display panels, such as an organic light-emitting display panel that includes an organic light-emitting diode (OLEDs), a quantum dot electroluminescence (QD-EL) device, or a liquid crystal display panel.

Display devices can be incorporated into various electronic devices, and thus display devices have various designs. For example, a four-side bent display device has been studied, in which an edge portion is bent so that the display panel can display an image not only on a front surface portion thereof, but also on four side surface portions that extend from the front surface portion.

In designing a display device in which an edge portion is bent as described above, a repulsive force generated from the bent members should be considered, as well as a lifting phenomenon caused by the repulsive force.

SUMMARY

Embodiments of the present disclosure provide a display device which minimizes a lifting phenomenon between members and efficiently utilizes an internal space of the display device.

An embodiment of a display device includes a display panel that is bent wherein at least a portion of the display panel overlaps another portion of the display panel; and a spacer surrounded by the display panel and that includes a flat portion and a bent portion connected to the flat portion, wherein an upper surface of the bent portion has a first curvature and a lower surface of the bent portion has a second curvature that differs from the first curvature.

An embodiment of a display device includes a driving substrate; a display panel that is bent wherein a portion of one side of the display panel to which the driving substrate is attached overlaps another portion of the display panel; a window member that covers the display panel and that includes a flat region and a curved region connected to the flat region; and a spacer that is surrounded by the display panel and is bent so that at least a portion has a curvature that corresponds to a curvature of the curved region of the window member, and at least a portion of an upper surface of the spacer has a first curvature and at least a portion of a lower surface of the spacer has a second curvature that differs from the first curvature.

An embodiment of a display device includes a display panel that includes a main region, a bent region that extends from one side of the main region and is bent in a thickness direction, and a sub region which extends from one side of the bent region, wherein the main region includes a flat region and a curved region that extends from one side of the flat region; and a spacer that is surrounded by the display panel and is bent so that at least a portion has a curvature that corresponds to a curvature of the curved region of the main region of the display panel. At least a portion of an upper surface of the spacer has a first curvature and at least a portion of a lower surface of the spacer has a second curvature different from the first curvature.

A display device according to an embodiment cart minimize a lifting phenomenon between members and more efficiently utilize an internal space of the display device.

DETAILED DESCRIPTION

Embodiments of the present disclosure will now be described more fully hereinafter with reference to the accompanying drawings, in which embodiments of the invention are shown. Embodiments of the disclosure may, however, be embodied in different forms and should not be construed as limited to the embodiments set forth herein. The same reference numbers may indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present.

Hereinafter, embodiments will be described with reference to the accompanying drawings.

Figure 1:
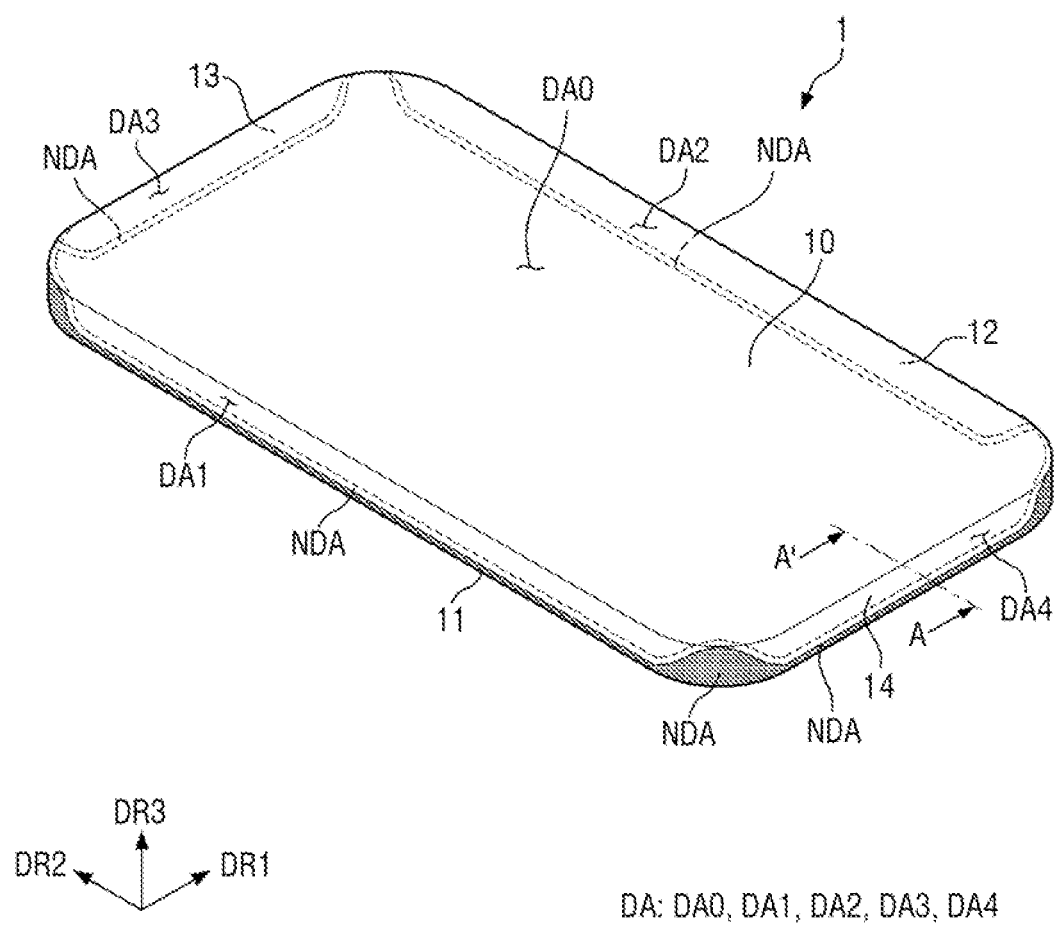
FIG. 1 is a perspective view of a display device according to an embodiment.
Figure 2:
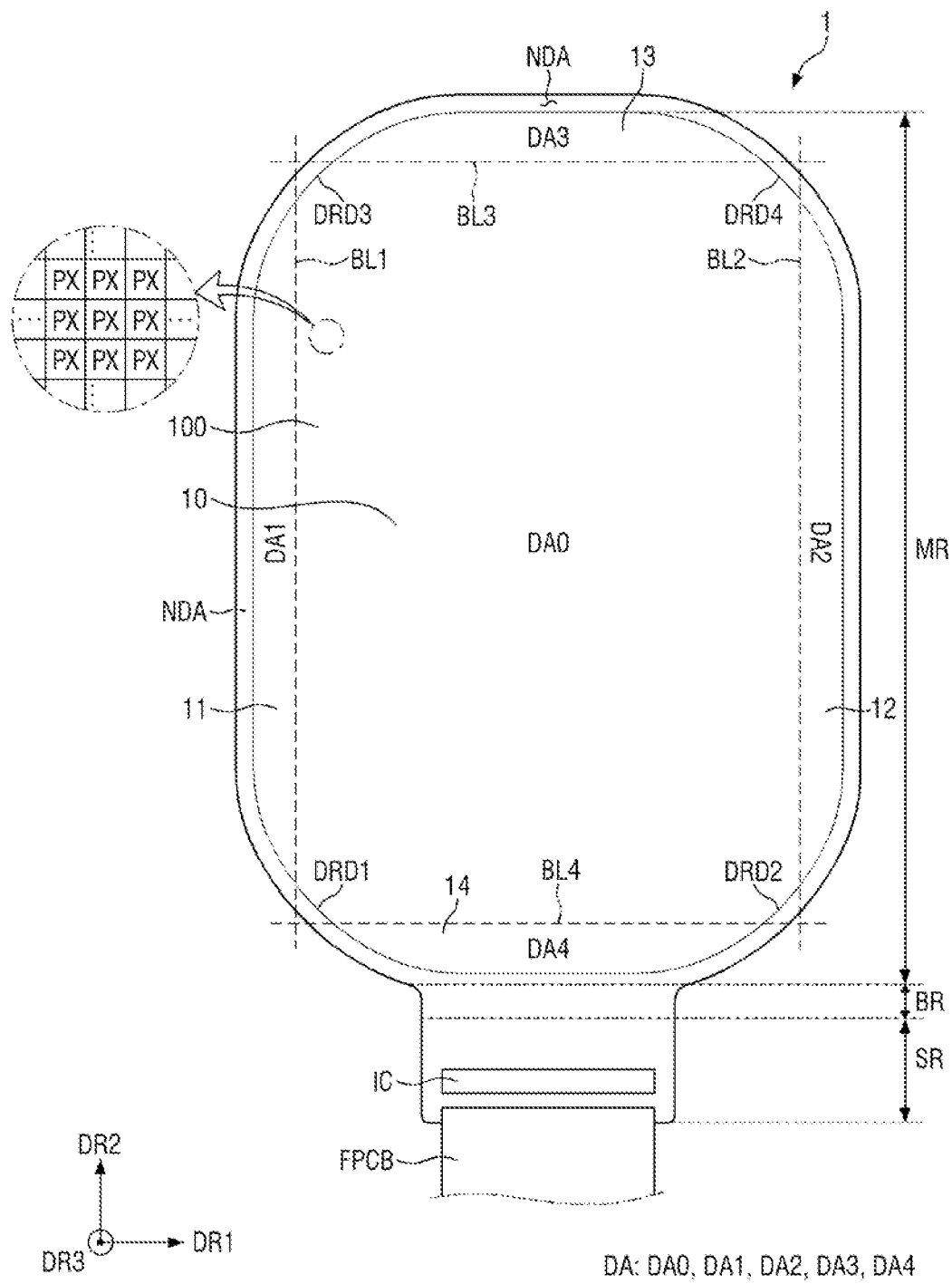
FIG. 2 is an exploded plan view of a display panel of a display device according to the embodiment.
Figure 3:
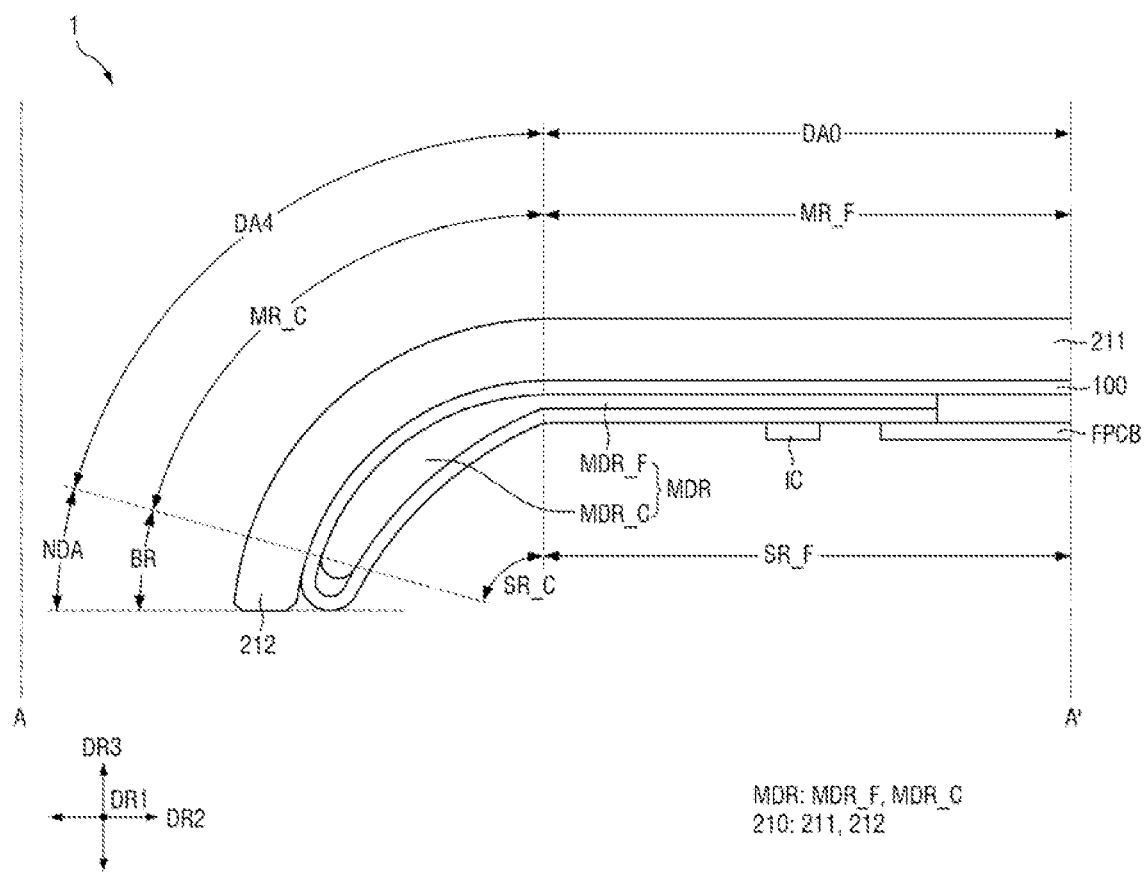
FIGS. 3 and 4 are cross-sectional views taken along line A-A' of FIG. 1.
Figure 4:
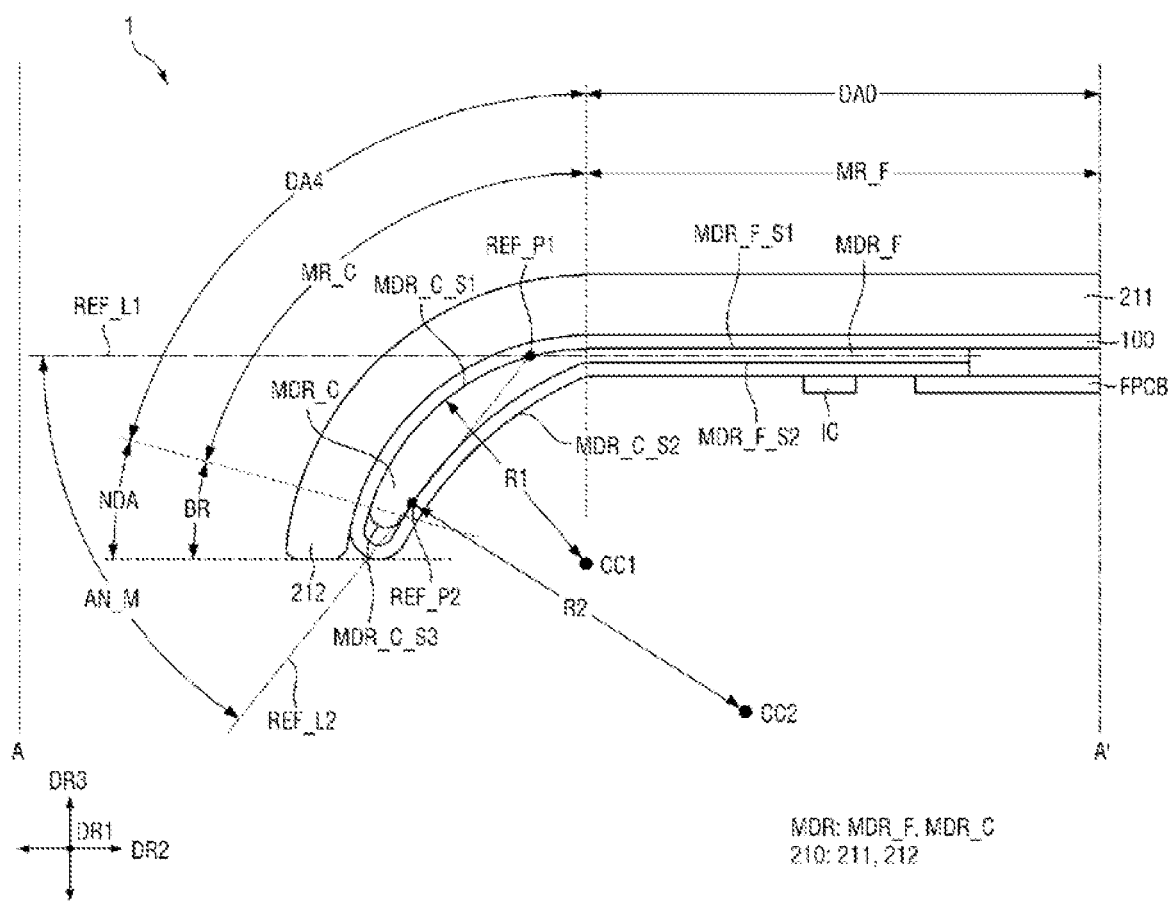
Figure 5:
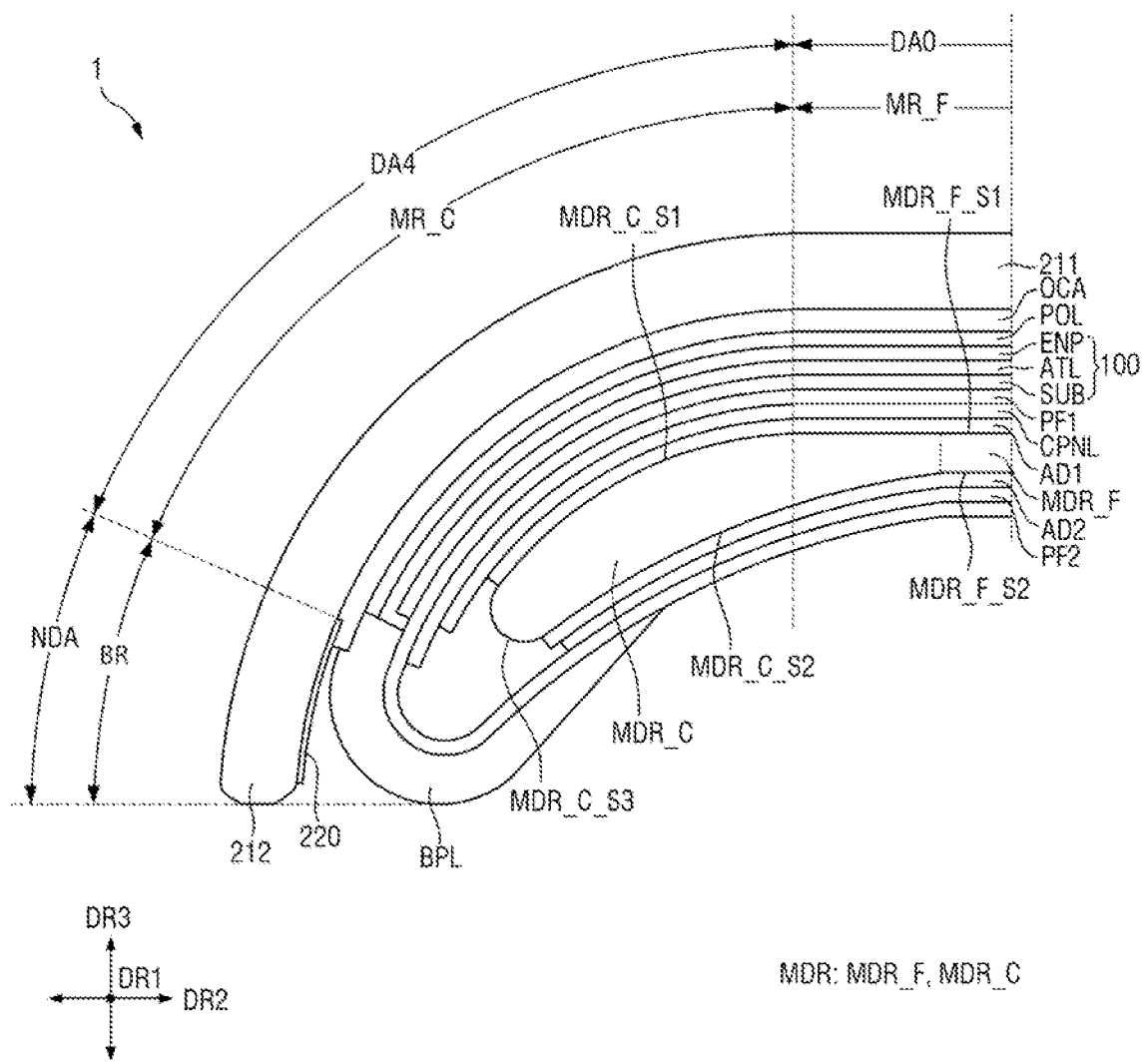
FIG. 5 is an enlarged cross-sectional view of a fourth sub display region of FIG. 3.
Figure 6:
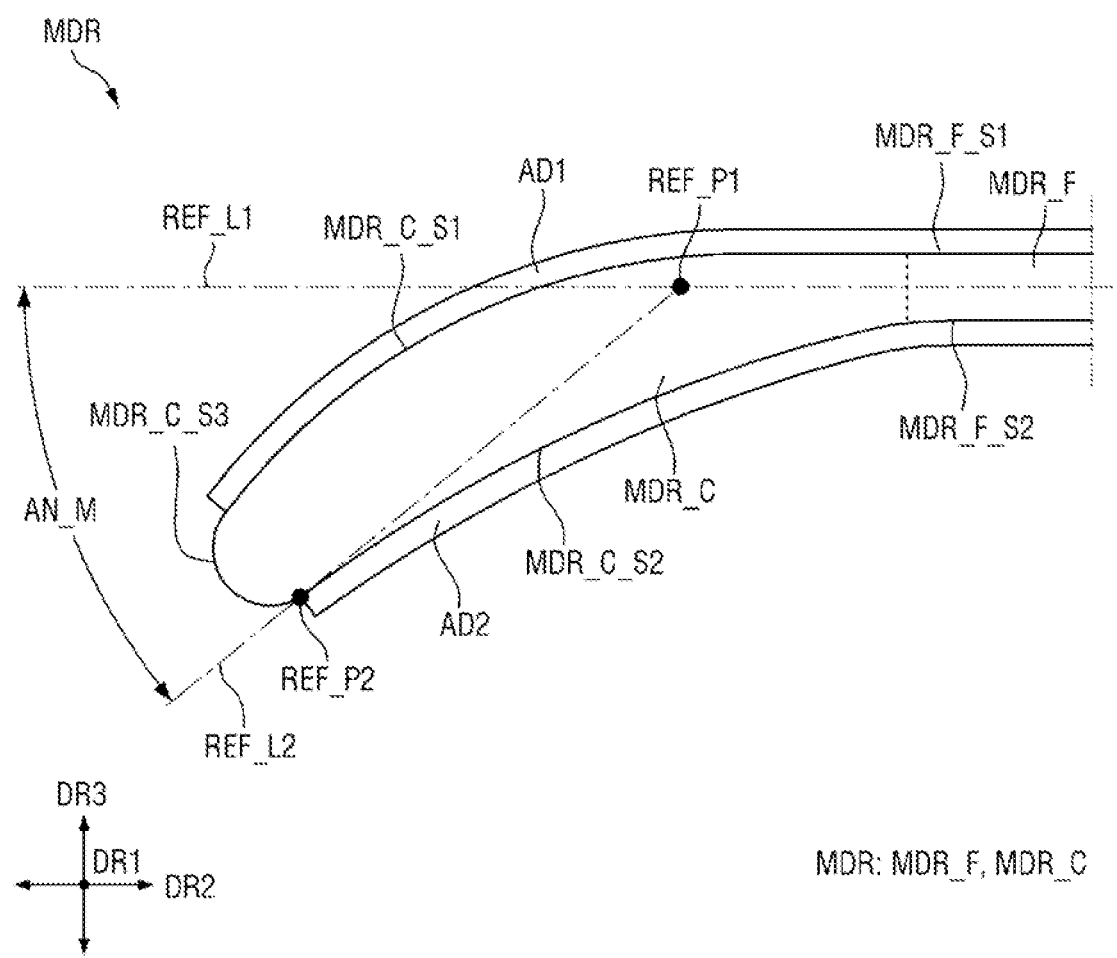
FIG. 6 is a cross-sectional view illustrating a spacer of FIG. 5.

FIG. 1 is a perspective view of a display device according to an embodiment. FIG. 2 is an exploded plan view of a display panel of a display device according to an embodiment. FIGS. 3 and 4 are cross-sectional views taken along line A-A' of FIG. 1. FIG. 5 is an enlarged cross-sectional view of a fourth sub display region of FIG. 3. FIG. 6 is a cross-sectional view illustrating a spacer of FIG. 5.

Hereinafter, a first direction DR1, a second direction DR2, and a third direction DR3 are different directions and cross each other. In an embodiment, the first direction DR1, the second direction DR2, and the third direction DR3 are mutually perpendicular, wherein the first direction DR1 may be a horizontal direction, the second direction DR2 may be a vertical direction, and the third direction DR3 may be a thickness direction. The first direction DR1, the second direction DR2, and the third direction DR3 include two or more directions. For example, the third direction DR3 may include an upward direction and a downward direction. In this case, one surface of a member disposed to face in the upward direction may be referred to as an upper surface, and the other surface of the member disposed to face in the downward direction may be referred to as a lower surface. However, the above directions are relative and are not limited to those mentioned above.

A display device 1 may be one of various devices for displaying screens or images. A display device may be, for example, a smartphone, a mobile phone, a tablet personal computer (PC), a personal digital assistant (PDA), a portable multimedia player (PMP), a television, a game machine, a wrist watch type electronic device, a head mounted display, or a monitor of a PC, a notebook computer, a car navigation system, a car dashboard, a digital camera, a camcorder, an external billboard, an electronic sign, various types of medical devices, various types of inspection devices, various home appliances that include display portions, such as a refrigerator, a washing machine, etc., an Internet of Things device, etc., but embodiments of the present disclosure are not limited thereto.

Referring to FIG. 1, in an embodiment, a display device 1 has a substantially rectangular shape in a top view. The display device 1 has two short sides that extend in a first direction DR1 and two long sides that extend in a second direction DR2. In an embodiment, a corner of the display device 1 is rounded, but embodiments of the present disclosure are not limited thereto. In some embodiments, the display device 1 has a sharp corner in which the short side and the long side are orthogonal to each other.

In an embodiment, the display device 1 includes a main display surface 10 and a plurality of sub display surfaces 11, 12, 13, and 14.

In an embodiment, the main display surface 10 is disposed on an upper surface of the display device 1. The upper surface is parallel to the first direction DR1 and the second direction DR2. The main display surface 10 has a substantially flat shape. The main display surface 10 has an area (or a size) greater than that of each of the sub display surfaces 11, 12, 13, and 14. In an embodiment, the main display surface 10 has a substantially rectangular shape in a top view. In some embodiments, the main display surface 10 may have one of various planar shapes, such as a polygonal shape, a circular shape, or an elliptical shape. In some embodiments, the main display surface 10 is disposed on a side surface or a lower surface of the display device 1.

In an embodiment, the plurality of sub display surfaces 11, 12, 13, and 14 are respectively disposed on four side surfaces located between upper and lower surfaces of the display device 1. That is, the plurality of sub display surfaces 11, 12, 13, and 14 are disposed on different surfaces from the main display surface 10. The four side surfaces include two surfaces parallel to the first direction DR1 and the third direction DR3 and two surfaces parallel to the second direction DR2 and the third direction DR3. Each of the plurality of sub display surfaces 11, 12, 13, and 14 has an area smaller than that of the main display surface 10. Each of the plurality of sub display surfaces 11, 12, 13 and 14 is connected to a corresponding edge of the main display surface 10 and is bent from the main display surface 10. That is, the display device 1 is a multi-sided display device 1 so that an image is displayed on an upper surface thereof and on side surfaces connected to the upper surface.

In an embodiment, the display device 1 includes the main display surface 10 and the four sub display surfaces 11, 12, 13, and 14 connected to the four sides of the main display surface 10, but embodiments of the present disclosure are not limited thereto. In some embodiments, the display device 1 includes some, but not all, of the four sub display surfaces 11, 12, 13, and 14.

Hereinafter, in an embodiment, for convenience of description, the sub display surface 11 located at a lower left of FIG. 1, the sub display surface 12 located at a lower right, the sub display surface 13 located at an upper left, and the sub display surface 14 located at an upper right, may be referred to as a first sub display surface 11, a second sub display surface 12, a third sub display surface 13, and a fourth sub display surface 14, respectively.

The display deice 1 includes a display region DA in which an image is displayed and non-display regions NDA in which no image is displayed.

In an embodiment, the display region DA includes a main display region DA0 and a plurality of sub display regions DA1, DA2, DA3, and DA4.

In an embodiment, the main display region DA0 is located on the main display surface 10. The main display surface 10 includes only the main display region DA0.

In an embodiment, the plurality of sub display regions DA1, DA2, DA3, and DA4 include a first sub display region DA1, a second sub display region DA2, a third sub display region DA3, and a fourth sub display region DA4.

In an embodiment, the first sub display region DA1 is located on the first sub display surface 11. The first sub display region DA1 is connected to the main display region DA0. Similarly, the second sub display region DA2, the third sub display region DA3 and the fourth sub display region DA4 are located on the second sub display surface 12, the third sub display surface 13, and the fourth sub display surface 14, respectively, and each is connected to the main display region DA0.

In an embodiment, the non-display regions NDA are located around the display region DA. The non-display regions NDA are located along the main display region DA0 and outermost edges of all of the plurality of sub display regions DA1, DA2, DA3, and DA4. In the non-display regions NDA, signal lines or driving circuits that transmit signals to the display region DA are disposed. The non-display regions NDA are the remaining regions of the display device 1 in which the display regions are not located.

Referring further to FIG. 2, in an embodiment, the display device 1 includes a display panel 100 that provides a display screen.

Examples of the display panel 100 include an organic light-emitting display panel, a micro light-emitting diode (LED) display panel, a nano LED display panel, a quantum dot electroluminescence display panel, a liquid crystal display panel, a plasma display panel, a field emission display panel, an electrophoretic display panel, or an electrowetting display panel, etc. Hereinafter, as an example of the display panel 100, an organic light-emitting display panel is considered, but embodiments of the present disclosure are not limited thereto, and any other display panel may also be considered as long as the same technical idea is applicable thereto.

In an embodiment, the display panel 100 includes a plurality of pixels PX. The plurality of pixels PX are arranged in a matrix form. Each pixel PX has a rectangular or square shape in a top view, but embodiments of the present disclosure are not limited thereto, and in other embodiments, each pixel PX may have, e.g., a rhombus shape in which sides thereof are inclined with respect to the first direction DR1. Each pixel PX includes a light emission region. Each light emission region may have the same shape as or a different shape from the pixel PX.

The display panel 100 is flexible and thus may be bent. In an embodiment, the display panel 100 is disposed on the main display surface 10 and the plurality of sub display surfaces 11, 12, 13, and 14. Four side edge portions of the display panel 100 are bent with respect to a plurality of bending axes in a thickness direction thereof. For example, referring to FIG. 2, a left-side edge portion, a right-side edge portion, an upper-side edge portion, and a lower side of the edge portion of the display panel 100 are bent with respect to a first bending axis BL1, a second bending axis BL2, a third bending axis BL3, and a fourth bending axis BL4, respectively, in the thickness direction, and are disposed on the first sub display surface 11, i.e., the first sub display region DA1, the second sub display surface 12, i.e., the second sub display region DA2, the third sub display surface 13, i.e., the third sub display region DA3, and the fourth sub display surface 14, i.e., the fourth sub display region DA4, respectively. In this case, a central portion of the display panel 100 is disposed on the main display surface 10. In an embodiment, the first bending axis BL1 and the second bending axis BL2 extend in a second direction DR2, and the third bending axis BL3 and the fourth bending axis BL4 extend in the first direction DR1, but embodiments of the present disclosure are not limited thereto.

In an embodiment, the display panel 100 includes a first display round portion DRD1, a second display round portion DRD2, a third display round portion DRD3, and a fourth display round portion DRD4, which are located at four corners of the main display surface 10, respectively. Since the first display round portion DRD1, the second display round portion DRD2, the third display round portion DRD3 and the fourth display round portion DRD4 are substantially the same or similar to each other except for their positions, hereinafter, the first display round portion DRD1 will be mainly described.

In an embodiment, the first display round portion DRD1 is located between the first sub display surface 11 and the fourth sub display surface 14, i.e., between the first sub display region DA1 and the fourth sub display region DA4. One end of the first display round portion DRD1 extends to an edge of the first sub display surface 11, and the other end of the first display round portion DRD1 extends to an edge of the fourth sub display surface 14.

The first display round portion DRD1, the second display round portion DRD2, the third display round portion DRD3, and the fourth display round portion DRD4 may have substantially the same curvature or may have different curvatures. For example, at least two of the first display round portion DRD1, the second display round portion DRD2, the third display round portion DRD3, and the fourth display round portion DRD4 may have substantially the same curvature. Further, each of the first to fourth display round portions DRD1 to DRD4 may have a substantially constant curvature or a variable curvature.

Referring to FIGS. 1 to 3, in an embodiment, the display panel 100 includes a main region MR, a bent region BR, and a sub region SR.

In an embodiment, the display region DA is located in the main region MR. The main region MR has a substantially rectangular shape in a top view, but embodiments of the present disclosure are not limited thereto.

In an embodiment, the main region MR includes a flat region MR_F that is substantially flat in a cross-sectional view, and a curved region MR_C that extends from one side of the flat region MR_F. Most of the flat region MR_F of the main region MR is located in the main display region DA0, and most of the curved region MR_C of the main region MR is located in at least one of the plurality of sub display regions DA1, DA2, DA3, and DA4. For example, as illustrated in FIG. 3, the curved region MR_C the main region MR is located in the fourth sub display region DA4, in which a spacer MDR, to be described below, is disposed. However, the arrangement of the curved region MR_C of the main region MR is not limited thereto. For example, the curved region MR_C may be located in any of the plurality of sub display regions DA1, DA2, DA3 and DA4. As another example, the curved region MR_C may be located only in the fourth sub display region DA4. As still another example, the curved region MR_C may be located in the fourth sub display region DA4 and may be further located in at least one of the first sub display region DA1, the second sub display region DA2, and the third sub display region DA3.

In an embodiment, the bent region BR has one side connected to the main region MR and the other side connected to the sub region SR. Specifically, one side of the bent region BR is connected to one side of the fourth sub display surface 14, which is a lower side of the fourth sub display surface 14 shown in FIG. 2, and the other side of the bent region BR is connected to a side of the sub region SR. That is, the bent region BR is located between the main region MR and the sub region SR.

In an embodiment, the bending region BR is bent in a C shape or a U shape in a cross-sectional view. In an embodiment, the fourth sub display surface 14 is bent with respect to the fourth bending axis of the main display surface 10, and the bent region BR is further bent with respect to the lower side of the fourth sub display surface 14. Accordingly, the bent region BR, the sub region SR, and a driving substrate FPCB can be disposed an a lower surface of the display panel 100, and at least some of the bent region BR, the sub region SR, and a driving substrate FPCB overlap the display panel 100.

In an embodiment, the sub region SR is connected to a lower side of the bent region BR. The sub region SR can be bent with respect to the bent region BR in the thickness direction and overlaps the main region MR. In an embodiment, a pad portion is located on the display panel 100 in the sub region SR and a driving chip IC is mounted on or attached to the pad portion, The driving chip IC includes an integrated circuit that drives the display panel 100. In an embodiment, the driving chip is a data driving integrated circuit that generates and transmits a data signal, but embodiments of the present disclosure are not limited thereto. In addition, the pad portion may further include a display panel signal line pad, a touch signal line pad, etc.

In an embodiment, the driving substrate FPCB is connected to an end portion of the sub region SR. The driving substrate FPCB includes a flexible printed circuit board or a film. The driving substrate FPCB may have various shapes in a top view.

Referring to FIG. 3, in an embodiment, the sub region SR includes a flat region SR_F that is substantially flat in a cross-sectional view and a curved region SR_C that extends from one side of the flat region SR_F. Most of the flat region SR_F of the sub region SR is located in the main display region DA0, and most of the curved region SR_C of the sub region SR is located in the fourth sub display region DA4. For example, most of the curved region SR_C is located in the fourth sub display region DA4, and a portion of the curved region SR_C extends over the main display region DA0.

In an embodiment, at least a portion of the flat region SR_F of the sub region SR is attached onto a rear surface of the flat region MR_F of the main region MR, and at least a portion of the curved region SR_C of the sub region SR is attached onto a rear surface of the curved region MR_C of the main region MR.

In an embodiment, the curved region MR_C of the main region MR and the curved region SR_C of the sub region SR have a shape that corresponds to a shape of a curved region 212 of a window member 210, to be described below, in a cross-sectional view. That is, the curved region MR_C of the main region MR and the curved region SR_C of the sub region SR are curved according to the shape of the curved region 212 of the window member 210 in the cross-sectional view. In this case, the curved region MR_C of the main region MR and the curved region SR_C of the sub region SR have a curvature that is less than a curvature of the bent region BR.

In an embodiment, the curved region MR_C of the main region MR and the curved region SR_C of the sub region SR have different curvatures. In an embodiment, the curved region MR_C of the main region MR has the same curvature as a lower surface of the curved region 212 of the window member 210, and the curved region SR_C of the sub region SR has a curvature that is greater than the curvature of the curved region MR_C of the main region MR. Specifically, the curved region MR_C of the main region MR has the same curvature as a first curvature of an upper surface MDR_C_S1 of a bent portion MDR_C of the spacer MDR, shown and described with reference to FIG. 4, below, and the curved region SR_C of the sub region SR has the same curvature as a second curvature of a lower surface MDR_C_S2, shown and described with reference to FIG. 4, below, of the bent portion MDR_C of the spacer MDR.

In an embodiment, the display device 1 further includes the window member 210. The window member 210 is disposed on the display panel 100. The window member 210 covers and protects the display panel 100. The window member 210 is attached onto one surface of the display panel 100 through a transparent bonding layer OCA to be described below.

In an embodiment, the window member 210 is made of a transparent material. The window member 210 includes, for example, glass or plastic. When the window member 210 includes plastic, the window member 210 is flexible.

In an embodiment, the window member 210 includes a flat region 211 and a curved region 212. The flat region 211 is substantially flat, and a planar shape of the flat region 211 corresponds to a planar shape of the applied display device 1. The curved region 212 is curved in the third direction DR3, for example, the downward direction of FIG. 3, and protrudes outward from the display panel 100.

In an embodiment, the display device 1 further includes the spacer MDR disposed between the main region MR and the sub region SR of the display panel 100.

In an embodiment, the spacer MDR extends over the fourth sub display region DA4 and a portion of the main display region DA0 adjacent to the fourth sub display region DA4. The spacer MDR is further disposed in the non-display region NDA connected to the fourth sub display region DA4.

In an embodiment, the spacer MDR includes a flat portion MDR_F and a bent portion MDR_C.

In an embodiment, the flat portion MDR_F of the spacer MDR is disposed between the flat region MR_F of the main region MR and the flat region SR_F of the sub region SR, and the bent portion MDR_C a the spacer MDR is disposed between the curved region MR_C of the main region MR and the curved region SR_C of the sub region SR. The bent portion MDR_C of the spacer MDR is bent to correspond to a curvature of the curved region 212 of the window member 210 or the curved region MR_C of the main region MR so that the spacer MDR is substantially mandrel-shaped in a cross-sectional view. The spacer MDR is in direct contact with the main region MR and the sub region SR, and one or more other members may be interposed between the spacer MDR and the main region MR or between the spacer MDR and the sub region SR. A detailed stack structure of the display device 1 will be described below with reference to FIG. 5.

In an embodiment, an end portion of a first side of the spacer MDR, for example, a left-side end portion of FIG. 3, is located between the curved region MR_C of the main region MR and the curved region SR_C of the sub region SR, and an end portion of a second side of the spacer MDR, for example, a right-side end portion of FIG. 3, is located between the flat region MR_F of the main region MR and the flat region SR_F of the sub region SR. In this case, the end portion of the first side of the spacer MDR is covered by the bent region BR, and the end portion of the second side of the spacer MDR is exposed in the second direction DR2 between the flat region MR_F of the main region MR and the flat region SR_F of the sub region SR. In an embodiment, the end portion of the first side of the spacer MDR is located in the non-display region NDA connected to the fourth sub display region DA4, but embodiments of the present disclosure are not limited thereto. In some embodiments, the end portion of the first side of the spacer MDR are located in the fourth sub display region DA4.

In an embodiment, the end portion of the first side of the spacer MDR is covered by the bent region BR and spaced apart from the bent region BR. Accordingly, a space is formed between the end portion of the first side of the spacer MDR and the display panel 100. In this case, when compared to a case in which the bent region BR of the display panel 100 is in pressed against an end portion of the spacer MDR, the bent region BR of the display panel 100 can be bent to have a relatively small curvature. Accordingly, stress caused by the bending of the bent region BR of the display panel 100 can be reduced. In some embodiments, the display panel 100 is bent and pressed against the end portion of the first side of the spacer MDR. In an embodiment, the end portion of the second side of the spacer MDR is aligned with an edge of the sub region SR in the main display region DA0, but embodiments of the present disclosure are not limited thereto.

In an embodiment, spacer MDR is made of a material that is highly flexible and machinable. The spacer MDR is made of, for example, a polycarbonate material that is easily injection-molded, but embodiments of the present disclosure are not limited thereto.

In an embodiment, the flat portion MDR_F and the bent portion MDR_C are integrally formed and are made of the same material, but embodiments of the present disclosure are not limited thereto. In some embodiments, the flat portion MDR_F and the bent portion MDR_C are made of different materials.

In an embodiment, the flat portion MDR_F is disposed in the main display region DA0. The flat portion MDR_F is disposed between the flat region MR_F of the main region MR and the flat region SR_F of the sub region SR and extends in the second direction DR2, and is flat.

In an embodiment, an end portion of a first side of the flat portion MDR_F such as a left-side end portion of FIG. 3, is located adjacent to a boundary between the main display region DA0 and the fourth sub display region DA4, or a boundary between the flat region MR_F of the main region MR and the curved region MR_C of the main region MR, and an end portion of a second side of the flat portion MDR_F, such as a right-side end portion of FIG. 3, is located in the main display region DA0. The end portion of the first side of the flat portion MDR_F may be located on the boundary between the main display region DA0 and the fourth sub display region DA4 or may be located in the main display region DA0.

In an embodiment, the flat portion MDR_F overlaps the flat region MR_F of the main region MR and the flat region SR_F of the sub region SR. In this case, the edge of the sub region SR located in the flat region MR_F of the main region MR and the end portion of the second side of the flat portion MDR_F, such as the right-side end portion, overlap and are aligned with each other. The flat portion MDR_F overlaps the driving chip IC in the sub region SR or at least a portion of the driving substrate FPCB.

In an embodiment, the flat portion MDR_F has a thickness substantially less than or equal to that of the bent portion MDR_C. For example, the thickness of the flat portion MDR_F may range from about 0.2 mm to 0.3 mm, but embodiments of the present disclosure are not limited thereto.

In an embodiment, thee bent portion MDR_C is disposed in the fourth sub display region DA4. The bent portion MDR_C is further disposed in the non-display region NDA that is connected and adjacent to the fourth sub display region DA4. In an embodiment, the bent portion MDR_C extends over the fourth sub display region DA4, and a portion of the non-display region NDA, but embodiments of the present disclosure are not limited thereto. In some embodiments, the bent portion MDR_C is disposed in the fourth sub display region DA4 and the main display region DA0, or may be disposed only in the fourth sub display region DA4.

In an embodiment, the bent portion MDR_C is disposed between the curved region MR_C of the main region MR and the curved region SR_C of the sub region SR. An end portion of a first side of the bent portion MDR_C, such as a left-side end portion of FIG. 3, is surrounded by the curved region MR_C of the main region MR, the curved region SR_C of the sub region SR, and the bent region BR, and an end portion of a second side of the bent portion MDR_C, such as a right-side end portion of FIG. 3, is connected to the end portion of the first side of the flat portion MDR_F.

In an embodiment, the bent portion MDR_C has a thickness greater than or equal to that of the flat portion MDR_F. Specifically, the thickness of the bent portion MDR_C is substantially the same as the flat portion MDR_F at the end portion of the second side connected to the flat portion MDR_F, increases in a direction toward a central portion of the bent portion MDR_C between the end portions of the first and second sides of the bent portion MDR_C, and decreases in a direction toward the end portion of the first side of the bent portion MDR_C. For example, an average thickness of the bent portion MDR_C may be about 0.25 mm or more, but embodiments of the present disclosure are not limited thereto.

Referring further to FIG. 4, in an embodiment, the flat portion MDR_F include an upper surface MDR_F_S1 that faces the flat region MR_F of the main region MR, and a lower surface MDR_F_S2 that faces the flat region SR_F of the sub region SR. The upper surface MDR_F_S1 and the lower surface MDR_F_S2 of the flat portion MDR_F both extend in the second direction DR2, and are flat.

In an embodiment, the bent portion MDR_C includes an upper surface MDR_C_S1, that faces the curved region MR_C of the main region MR and is connected to the upper surface MDR_F_S1 of the flat portion MDR_F, and a lower surface MDR_C_S2 that faces the curved region SR_C of the sub region SR and is connected to the lower surface MDR_F_S2 of the flat portion MDR_F. The bent portion MDR_C further includes a side surface MDR_C_S3 that is located on the end portion of the one side of the bent portion MDR_C, connects the upper surface MDR_F_S1 of the flat portion MDR_F to the lower surface MDR_F_S2, and has a convex shape. The upper surface MDR_F_S1 of the flat portion MDR_F and the upper surface MDR_C_S1 of the bent portion MDR_C form an upper surface of the spacer MDR, and the lower surface MDR_F_S2 of the flat portion MDR_F and the lower surface MDR_C_S2 of the bent portion MDR_C form a lower surface of the spacer MDR.

As described above, in an embodiment, the bent portion MDR_C is bent in the thickness direction from the end portion of the first side of the flat portion MDR_F. The upper surface MDR_C_S1 and the lower surface MDR_C_S2 of the bent portion MDR_C have different curvatures. Hereinafter, for convenience of description, the curvature of the upper surface MDR_C_S1 of the bent portion MDR_C, the curvature of the lower surface MDR_C_S2, and the curvature of the side surface MDR_C_S3 are referred to as a first curvature, a second curvature, and a third curvature, respectively.

In an embodiment, the upper surface MDR_C_S1 of the bent portion MDR_C has the first curvature, and the lower surface MDR_C_S2 of the bent portion MDR_C has the second curvature that is less than the first curvature. The side surface MDR_C_S3 of the bent portion MDR_C has the third curvature that is greater than the first curvature and the second curvature. In some embodiments, the first curvature, the second curvature, and the third curvature include two or more curvatures. In some embodiments, the side surface MDR_C_S3 of the bent portion MDR_C is flat.

In an embodiment, the first curvature corresponds to the curved region MR_C of the main region MR of the display panel 100 on the upper surface MDR_C_S1 of the bent portion MDR_C, and to the curved region 212 of the window member 210. The first curvature is the same as a curvature of a lower surface of the curved region MR_C of the main region MR that faces the upper surface MDR_C_S1 of the bent portion MDR_C.

The first curvature and the second curvature. are defined as an inverse of a first radius R1 of curvature and an inverse of a second radius R2 of curvature, respectively. The first curvature has the first radius R1 of curvature from a first center CC1 of curvature, and the second curvature has a second radius R2 of curvature from a second center CC2 of curvature that is greater than the first radius R1 of curvature. Hereinafter, as will be described below with reference to FIG. 13, the first radius R1 of curvature, the second radius R2 of curvature, and a bent angle of the bent portion MDR_C are determined based on how much the repulsive forces of other members stacked on the spacer MDR are reduced and on an efficient space utilization of the display device 1.

For example, in an embodiment, the first radius R1 of curvature of the first curvature ranges from about 3 mm to 5 mm, and the second radius R2 of curvature of the second curvature ranges from about 5 mm to 7 mm. As another example, the first radius R1 of curvature is about 1.5 times the second radius R2 of curvature. As still another example, the first radius R1 of curvature ranges from about 14 times to 18 times the thickness of the flat portion MDR_F, and the second radius R2 of curvature ranges from about 22 times to 26 times the thickness of the flat portion MDR_F.

In an embodiment, the first center CC1 of curvature and the second center CC2 of curvature are located below the window member 210 and the display panel 100 in a cross-sectional view.

In an embodiment, the first center CC1 of curvature is located closer to an outer edge of the display device 1, such as a left side of FIG. 4, than the second center CC2 of curvature, and the second center CC2 of curvature is located closer to an inner side of the display device 1, such as a right side of FIG. 4, than the first center CC1 of curvature, but embodiments of the present disclosure are not limited thereto. In some embodiments, the first center CC1 of curvature is located at the inner side of the display device 1, and the second center CC2 of curvature is located adjacent to the outer edge of the display device 1. In some embodiments, the first center CC1 of curvature and the second center CC2 of curvature are located on the same vertical line.

In an embodiment, the first center CC1 of curvature is located closer to the boundary between the main display region DA0 and the fourth sub display region DA4 than the second center CC2 of curvature. The first center CC1 of curvature overlaps the boundary between the main display region DA0 and the fourth sub display region DA4, but embodiments of the present disclosure are not limited thereto. In some embodiments, the first center CC1 of curvature is located in the fourth sub display region DA4 or located in the main display region DA0. The second center CC2 of curvature is located in the main display region DA0, but embodiments of the present disclosure are not limited thereto.

In an embodiment, the bent portion MDR_C forms a predetermined angle AN_M with the flat portion MDR_F. The predetermined angle AN_M is measured between a first reference line REF_L1 and a second reference line REF_L2 that each extends from a first reference point REF_P1.

In an embodiment, the first reference line REF_L1 is straight and parallel to the upper surface MDR_F_S1 and/or the lower surface MDR_F_S2 of the flat portion MDR_F in a cross-sectional view. The first reference line REF_L1 extends in the second direction DR2 and passes through a center of the flat portion MDR_F or bisects the flat portion MDR_F. The second reference line REF_L2 is tangent at a second reference point REF_P2 of the lower surface MDR_C_S2 of the bent portion MDR_C. The second reference point REF_P2 of the lower surface MDR_C_S2 of the bent portion MDR_C is located at an edge of the lower surface MDR_C_S2 of the bent portion MDR_C. In some embodiments, the second reference point REF_P2 is located at an edge of the upper surface MDR_C_S1 of the bent portion MDR_C. The first reference point REF_P1 is where the first reference line REF_L1 and the second reference line REF_L2 intersect. The first reference point REF_P1 may be located inside the spacer MDR in a cross-sectional view, may be located at a boundary of the spacer MDR, or may be located outside the spacer MDR.

In an embodiment, the predetermined angle AN_M ranges from about 35° to 40°. The predetermined angle AN_M is less than an angle at which the curved region 212 of the window member 210 is bent, hereinafter referred to as the angle of the curved region 212. The angle of the curved region 212 is measured similar to a method of measuring the predetermined angle AN_M of the spacer MDR. For example, the angle of the curved region 212t is measured between the straight line that extends in the second direction DR2 and passes through the center of the flat region 211 of the window member 210, and the tangent line in contact with the end portion of the curved region 212 of the window member 210. In an embodiment, the angle of the curved region 212 ranges from about 60° to 120°.

Referring further to FIGS. 5 and 6, in an embodiment, at least another member is interposed between the display panel 100 and the spacer MDR, and the display device 1 further includes a first adhesive layer AD1 and a second adhesive layer AD2 that bond the at least another member to the spacer MDR.

In an embodiment, the display panel 100 includes a base substrate SUB, an active device layer ATL, and a thin film encapsulation layer ENP.

In an embodiment, the base substrate SUB provides a surface on which the active device layer ATL is disposed and supports the active device layer ATL. The base substrate SUB includes a flexible polymer material such as polyimide and accordingly, the base substrate SUB can be curved, bent, folded, or rolled. That is, the base substrate SUB is flexible.

In an embodiment, the base substrate SUB is bent in the bent region BR. Accordingly, the sub region SR located on the other side of the bent region BR is inverted with respect to the bent region BR and is located on a lower surface of the main region MR. In this case, the main region MR of the base substrate SUB on one side of the bent region BR and the sub region SR of the base substrate SUB on the other side of the bent region BR are pressed against each other and attached.

In an embodiment, the active device layer ATL disposed on one surface of the base substrate SUB. The active device layer ATL emits light that can display an image on the display device 1. The active device layer ATL includes a light-emitting element that emits light and a thin film transistor that drives the light-emitting element. The active device layer ATL is disposed in the main region MR, but embodiments of the present disclosure are not limited thereto, and in other embodiments, the active device layer ATL is disposed in the bent region BR or the sub region SR.

In an embodiment, the thin film encapsulation layer ENP is disposed on the active device layer ATL. The thin film encapsulation layer ENP covers the active device layer ATL and prevents the active device layer ATL from being exposed to moisture or air.

In some embodiments, the display device 1 further includes a touch layer. The touch layer is disposed on the thin film encapsulation layer ENP. The touch layer includes a plurality of touch electrodes. The touch electrodes have a mesh shape. The touch layer may be omitted.

In an embodiment, the display device 1 further includes a transparent bonding layer OCA, a polarizing layer POL, a first support member PF1, a cover panel CPNL, a first adhesive layer AD1, a second adhesive layer AD2, a second support member PF2, and a bent protective member BPL.

In an embodiment, the transparent bonding layer OCA and the polarizing layer POL are interposed between the window member 210 and the display panel 100. The transparent bonding layer OCA and the polarizing layer POL extend over the main display region DA0 and the fourth sub display region DA4. Portions of the transparent bonding layer OCA and the polarizing layer POL located in the fourth sub display region DA4 are bent and correspond to the shape of the curved region 212 of the window member 210.

In an embodiment, the transparent bonding layer OCA is interposed between the window member 210 and the polarizing layer POL. The transparent bonding layer OCA attaches the display panel 100 to the window member 210. The transparent bonding layer OCA includes an optically transparent adhesive or an optically transparent resin.

In an embodiment, the polarizing layer POL is interposed between the transparent bonding layer OCA and the thin film encapsulation layer ENP of the display panel 100. The polarizing layer POL polarizes light passing therethrough. The polarizing layer POL reduces reflection of external light.

In an embodiment, the display device 1 further includes a printing layer 220 disposed on the window member 210. The printing layer 220 is disposed on a surface of the window member 210. The printing layer 220 is disposed on an edge portion of the window member 210, such as an edge portion of the curved region 212, and is disposed in the non-display region NDA. The printing layer 220 may be a light-shielding layer or a decorative layer that imparts a sense of aesthetics.

In an embodiment, the first support member PF1, the cover panel CPNL, and the first adhesive layer AD1 are interposed between the main region MR and the spacer MDR of the display panel 100. Specifically, the first support member PF1, the cover panel CPNL, and the first adhesive layer AD1 are interposed between the main region MR of the display panel 100 and the upper surface MDR_F_S1 of the flat portion MDR_F of the spacer MDR and between the main region MR of the display panel 100 and the upper surface MDR_C_S1 of the bent portion MDR_C of the spacer MDR. The first support member PF1, the cover panel CPNL, and the first adhesive layer AD1 are sequentially stacked in a downward direction from a lower surface of the substrate SUB toward an upper surface of the spacer DR.

In an embodiment, the first support member PF1, the cover panel CPNL, and the first adhesive layer AD1 extend over the main display region DA0 and the fourth sub display region DA4. The first support member PF1, the cover panel CPNL, and the first adhesive layer AD1 that are disposed in the fourth sub display region DA4 are bent and correspond to the shape of the curved region 212 of the window member 210.

In an embodiment, the first support member PF1 is interposed between the substrate SUB and the cover panel CPNL. The first support member PF1 is disposed on the lower surface of the substrate SUB in the main region MR and supports the substrate SUB. The first support member PF1 covers and protects the lower surface of the substrate SUB in the main region MR. The first support member PF1 supports the substrate SUB of the display panel 100 such that the shape of the display panel 100 is maintained during a manufacturing process of the display panel 100. The first support member PF1 is made of, for example, a film-type member that includes polyethylene terephthalate (PET).

In an embodiment, the cover panel CPNL is disposed on a lower surface of the first support member PF1. The cover panel CPNL is interposed between the first support member PF1 and the first adhesive layer AD1. The cover panel CPNL includes, for example, at least one functional layer, such as a heat dissipation layer or a cushion layer.

In an embodiment, the first adhesive layer AD1 is interposed between the cover panel CPNL and the spacer MDR. As illustrated in FIG. 6, the first adhesive layer AD1 extends over the upper surface MDR_F_S1 of the flat portion MDR_F and the upper surface MDR_C_S1 of the bent portion MDR_C of the spacer MDR. The first adhesive layer AD1 attaches the spacer MDR to the cover panel CPNL. In some embodiments, the first adhesive layer AD1 includes an adhesive material such as an epoxy acrylic material, a urethane material, or a cyano acrylic material. In some embodiments, the first adhesive layer AD1 includes a thermosetting resin or an ultraviolet curable resin. In some embodiments, the first adhesive layer AD1 is a double-sided tape.

In an embodiment, the second adhesive layer AD2 and the second support member PF2 are interposed between the sub region SR of the display panel 100 and the spacer MDR. The second adhesive layer AD2 and the second support member PF2 extend over the main display region DA0 and the fourth sub display region DA4.

In an embodiment, the second adhesive layer AD2 is interposed between the spacer MDR and the second support member PF2. As illustrated in FIG. 6, the second adhesive layer AD2 extends over the lower surface MDR_F_S2 of the flat portion MDR_F and the lower surface MDR_C_S2 of the bent portion MDR_C of the spacer MDR. The second adhesive layer AD2 attaches the spacer MDR to the second support member PF2. The second adhesive layer AD2 may be made of the same or a similar material as the first adhesive layer AD1.

In an embodiment, the second adhesive layer AD2 has a thickness that differs from that of the first adhesive layer AD1. In an embodiment, the first adhesive layer AD1 has the thickness that is greater than that of the second adhesive layer AD2. For example, the thickness of the first adhesive layer AD1 ranges from about 0.75 mm to 1.25 mm, and the thickness of the second adhesive layer AD2 ranges from about 0.75 mm to 0.25 mm. As another example, the thickness of the first adhesive layer AD1 ranges from about 1.5 times to 2.5 times the thickness of the second adhesive layer AD2. In some embodiments, the first adhesive layer AD1 and the second adhesive layer AD2 have the same thickness, or the thickness of the first adhesive layer AD1 is less than the thickness of the second adhesive layer AD2.

In an embodiment, the second support member PF2 is interposed between the second adhesive layer AD2 and the substrate SUB in the sub region SR. The second support member PF2 is disposed on an upper surface of the substrate SUB in the sub region SR and supports the substrate SUB. Since the substrate SUB in the sub region SR is inverted as the display panel 100 is bent, when the display panel 100 is unfolded, the upper surface of the substrate SUB in the sub region SR becomes the lower surface of the substrate SUB in the sub region SR. Similar to the first support member PF1, the second support member PF2 is made of a film type member that includes polyethylene terephthalate (PET).

In an embodiment, the second support member PF2 has a thickness that differs from that of the first support member PF1. In an embodiment, the second support member PF2 has the thickness greater than that of the first support member PF1. Accordingly, curling of the cover panel CPNL on the first support member PF1 or curling of the display panel 100 can be prevented. For example, the thickness of the first support member PF1 ranges from about 45 µm to 55 µm, and the thickness of the second support member PF2 ranges from about 70 µm to 75 µm. As another example, the thickness of the second support member PF2 ranges from about 1.25 times to 1.75 times the thickness of the first support member PF1. As still another example, the thickness of the first adhesive layer AD1 is about twice the thickness of the first support member PF1, and the thickness of the second adhesive layer AD2 is greater than the thickness of the first support member PF1 and less than the thickness of the second support member PF2. In some embodiments, the first support member PF1 and the second support member PF2 have the same thickness, or the thickness of the first support member PF1 is less than the thickness of the second support member PF2.

In an embodiment, the bent protective member BPL covers a surface of the substrate SUB located in the bent region BR. The surface of the substrate SUB in the bent region BR is convex. The bent protective member BPL is made of, for example, a synthetic resin. In an embodiment, the bent protective member BPL covers the transparent bonding layer OCA, the polarizing layer POL, and at least portions of side surfaces of the display panel 100. One end of the bent protective member BPL located in the sub region SR of the display panel 100 has a thickness that decreases in a direction toward the inner side of the display device 1, such as toward the right side of FIG. 5. In an embodiment, the bent protective member BPL and the bent region BR of the display panel 100 do not protrude downward from the curved region 212 of the window member 210.

In an embodiment, the spacer MDR is interposed between the first adhesive layer AD1 and the second adhesive layer AD2. As described above, the spacer MDR extends over the main display region DA0 and the fourth sub display region DA4. The upper surface MDR_C_S1 of the bent portion MDR_C and the upper surface MDR_F_S1 of the flat portion MDR_F of the spacer MDR are directly attached onto the first adhesive layer AD1, and the lower surface MDR_C_S2 of the bent portion MDR_C and the lower surface MDR_F_S2 of the flat portion MDR of the spacer MDR are directly attached onto the second adhesive layer AD2. The end portion of the spacer MDR located in the fourth sub display region DA4 or the side surface MDR_C_S3 of the bent portion MDR_C are exposed between the first adhesive layer AD1 and the second adhesive layer AD2. The end portion of the spacer MDR or the side surface MDR_C_S3 of the bent portion MDR_C protrude from between the first adhesive layer AD1 and the second adhesive layer AD2.

As described above, in an embodiment, the upper surface MDR_C_S1 and the lower surface MDR_C_S2 of the bent portion MDR_C of the spacer MDR respectively have the first curvature having the first radius R1 of curvature and the second curvature having the second radius R2 of curvature greater than the first radius R1 of curvature.

In an embodiment, the first curvature is determined by the curvature of the curved region 212 of the window member 210, or the curvatures of the members interposed between the curved region 212 of the window member 210 and the upper surface MDR_C_S1 of the bent portion MDR_C of the spacer MDR, such as the transparent bonding layer OCA, the polarizing layer POL, the first support member PF1, the cover panel CPNL, and the first adhesive layer AD1. Further, the curvatures of the members interposed between the lower surface MDR_C_S2 of the bent portion MDR_C of the spacer MDR and the substrate SUB in the sub region SR of the display panel 100, such as the second adhesive layer and the second support member PF2, are determined by the second curvature of the lower surface MDR_C_S2 of the bent portion MDR_C of the spacer MDR.

In an embodiment, at least some of the members interposed between the curved region 212 of the window member 210 and the upper surface MDR_C_S1 of the bent portion MDR_C of the spacer MDR are bent with respect to the same first center CC1 of curvature, and at least some of the members interposed between the lower surface MDR_C_S2 of the bent portion MDR_C of the spacer MDR and the substrate SUB in the sub region SR of the display panel 100 are bent with respect to the same second center CC2 of curvature.

In an embodiment, the members disposed on the upper surface MDR_C_S1 and the lower surface MDR_C_S2 of the bent portion MDR_C of the spacer MDR such as the first support member PF1 and the second support member PF2, are bent to correspond to the curvature of the window or the display panel 100 and thus have a repulsive force or a restoring force to return to a flat state. Such a restoring force can cause a lifting phenomenon between the spacer MDR and the first support member PF1 or between the spacer MDR and the second support member PF2.

In the display device 1 according to an embodiment, the lower surface MDR_C_S2 of the bent portion MDR_C of the spacer MDR has a gentler curvature than the upper surface MDR_C_S1, and thus the above-described lifting phenomenon can be prevented. Further, a thickness difference between the first adhesive layer AD1 and the second adhesive layer AD2 and a thickness difference between the first support member PF1 and the second support member PF2 also enforce the adhesion of the first support member PF1 and the second support member PF2 with respect to the spacer MDR, and reduce the repulsive forces of the first support member PF1 and the second support member PF2, and thus the above-described lifting phenomenon can be prevented.

Figure 7:
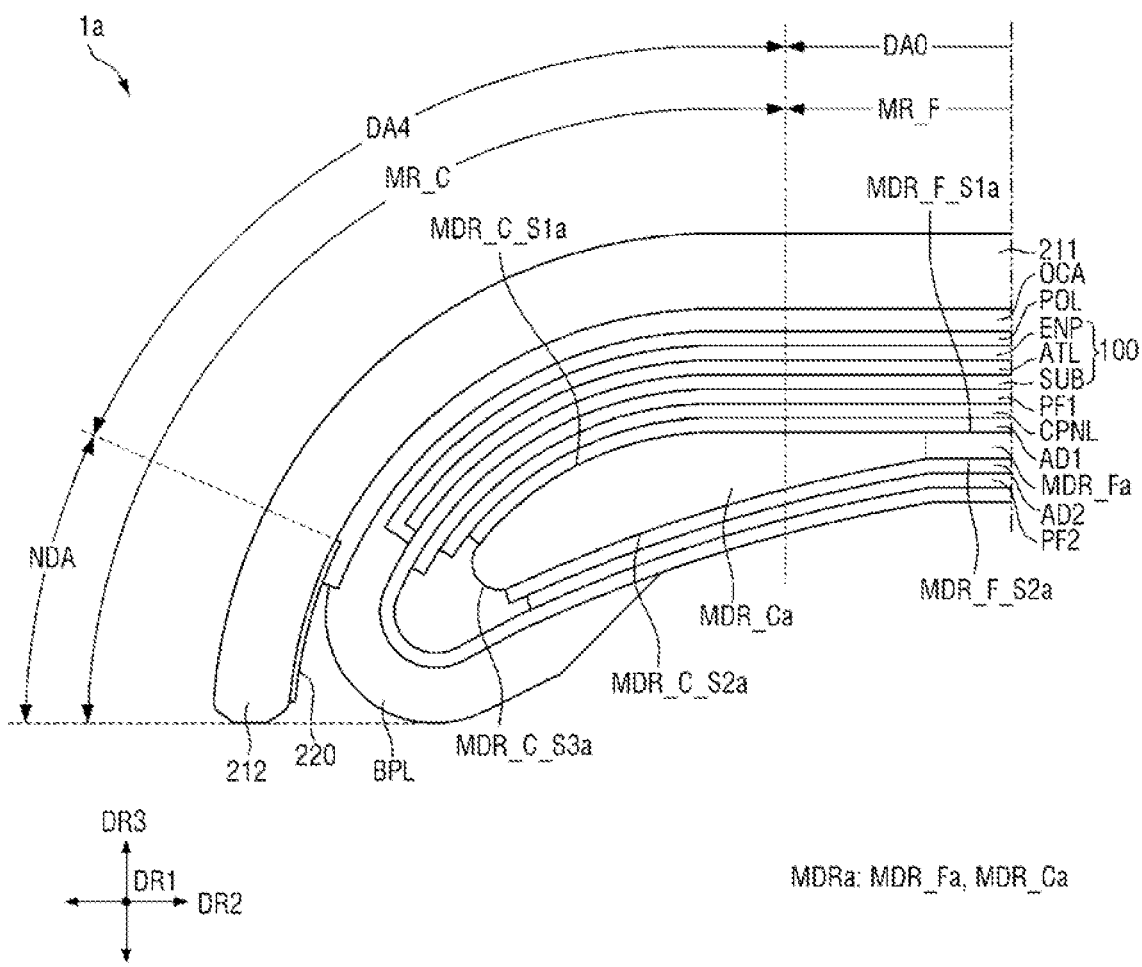
FIG. 7 is a cross-sectional view of a display device according to an embodiment.
Figure 8:
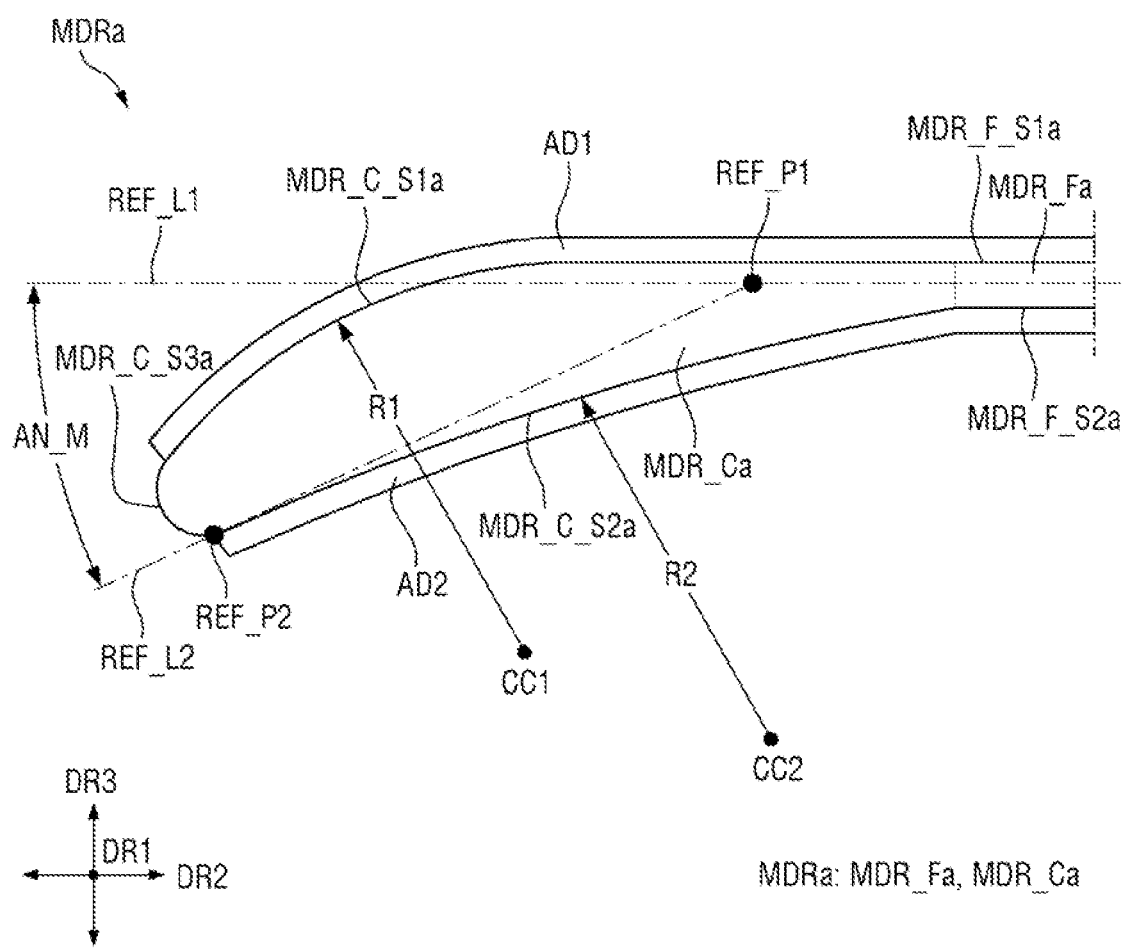
FIG. 8 is a cross-sectional view of a spacer of FIG. 7.

FIG. 7 is a cross-sectional view of a display device according to an embodiment. FIG. 8 is a cross-sectional view of a spacer of FIG. 7.

In an embodiment of FIG. 7, a curvature of a bent portion MDR_Ca of a spacer MDRa and an angle between the bent portion MDR_Ca and a flat portion MDR_Fa differ from those in embodiments of FIGS. 1 to 6.

Referring to FIGS. 4, 7, and 8, in an embodiment, the spacer MDRa is interposed between a first support member PF1 and a second support member PF2.

In an embodiment, the spacer MDRa includes the flat portion MDR_Fa disposed in a main display region DA0 and the bent portion MDR_Ca that extends over the main display region DA0 and a fourth sub display region DA4. In an embodiment of FIG. 7, a lower surface MDR_C_S2a of the bent portion MDR_Ca has a curvature that is less than that of embodiments of FIGS. 1 to 6, and thus a volume or area of the bent portion MDR_Ca disposed in the main display region DA0 is greater than that of embodiments of FIGS. 1 to 6.

In an embodiment, an upper surface MDR_C_S1a of the bent portion MDR_Ca has a first curvature based on a curvature of the curved region 212 of the window number 210 or curvatures of members interposed between the curved region 212 of the window member 210 and the bent portion MDR_Ca of the spacer MDRa. The lower surface MDR_C_S2a of the bent portion MDR_Ca has a second curvature that is than the first curvature. The first curvature is determined by the curvature of the curved region 212 of the window member 210 or by the curvatures of the members interposed between the curved region 212 of the window member 210 and the bent portion MDR_Ca of the spacer MDRa.

In an embodiment, the first curvature has a first center CC1 of curvature, and the second curvature has a second center CC2 of curvature. The first center CC1 of curvature is the same as a center of curvature of the curved region 212 of the window member 210 or centers of curvature of the members interposed between the curved region 212 of the window member 210 and the bent portion MDR_Ca of the spacer MDRa. The second center CC2 of curvature is the same as a center of curvature of the sub region SR of the display panel 100 or centers of curvature of the members interposed between the sub region SR of the display panel 100 and the bent portion MDR_Ca of the spacer MDRa.

In an embodiment, the first curvature has a first radius R1 of curvature, and the second curvature has a second radius R2 of curvature greater than the first radius R1 of curvature. The second radius R2 of curvature is greater than or about 6 mm. For example, the first radius R1 of curvature ranges from about 4 mm to 6 mm, and the second radius R2 of curvature ranges from about 9 mm to 11 mm. As another example, the second radius R2 of curvature ranges from about 1.5 times to 2 times the first radius R1 of curvature. As still another example, the first radius R1 of curvature ranges from about 18 times to 22 times a thickness of the flat portion MDR_Fa, and the second radius R2 of curvature ranges from about 42 times to 44 times the thickness of the flat portion MDR_Fa.

In an embodiment, the bent portion MDR_Ca forms a predetermined angle AN_M with the flat portion MDR_Fa. As illustrated in FIG. 4, the predetermined angle AN_M is measured between a first reference line REF_L1 and a second reference line REF_L2 that intersect at the first reference point REF_P1. The predetermined angle AN_M ranges from about 20° to 30°.

In an embodiment, a first adhesive layer AD1 is interposed between the first support member PF1 and the spacer MDRa, and a second adhesive layer AD2 is interposed between the second support member PF2 and the spacer MDRa. The first support member PF1 is attached by the first adhesive layer AD1 onto the upper surface MDR_C_S1a of the bent portion MDR_Ca of the spacer MDRa, and an upper surface MDR_F_S1a of the flat portion MDR_Fa of the spacer MDRa, and the second support member PF2 is attached the second adhesive layer AD2 onto the lower surface MDR_C_S2a of the bent portion MDR_Ca of the spacer MDRa and a lower surface MDR_F_S2a of the flat portion MDR_Fa of the spacer MDRa.

As illustrated in FIG. 8, in an embodiment, the first radius R1 of curvature and the second radius R2 of curvature of the bent portion MDR_Ca are greater than those of embodiments of FIGS. 1 to 6, and the bent portion MDR_Ca is bent with a gentler angle than in embodiments of FIGS. 1 to 6. Accordingly, repulsive forces of the first support member PF1 and the second support member PF2 attached to the spacer MDRa are reduced, and a lifting phenomenon cause by the repulsive forces is also reduced.

In an embodiment of FIG. 7, since a curvature of the bent portion MDR_Ca of the spacer MDRa and an angle between the bent portion MDR_Ca and the flat portion MDR_Fa are substantially the same as or similar to those of the embodiments of FIGS. 1 to 6, redundant descriptions thereof will be omitted.

Figure 9:
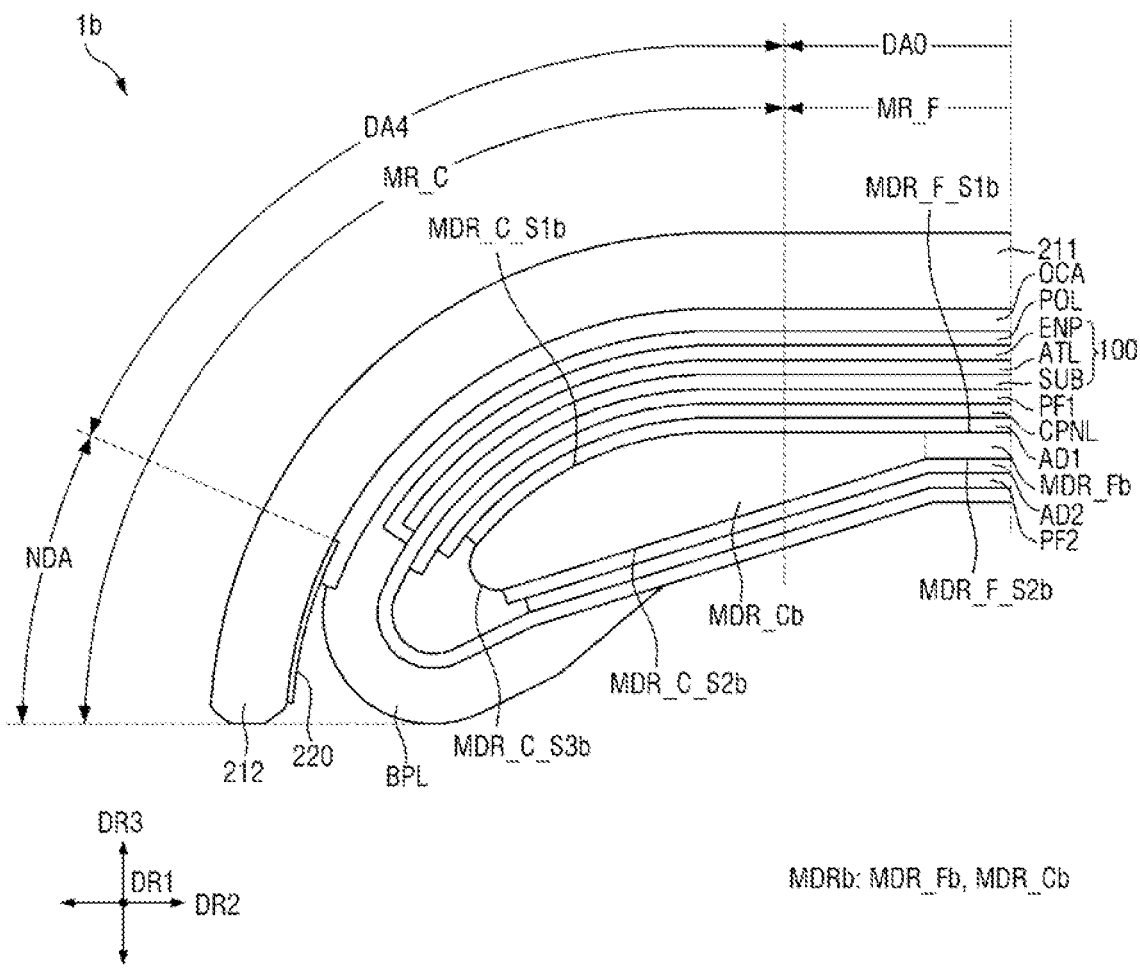
FIG. 9 is a cross-sectional view of a display device according to still another embodiment.
Figure 10:
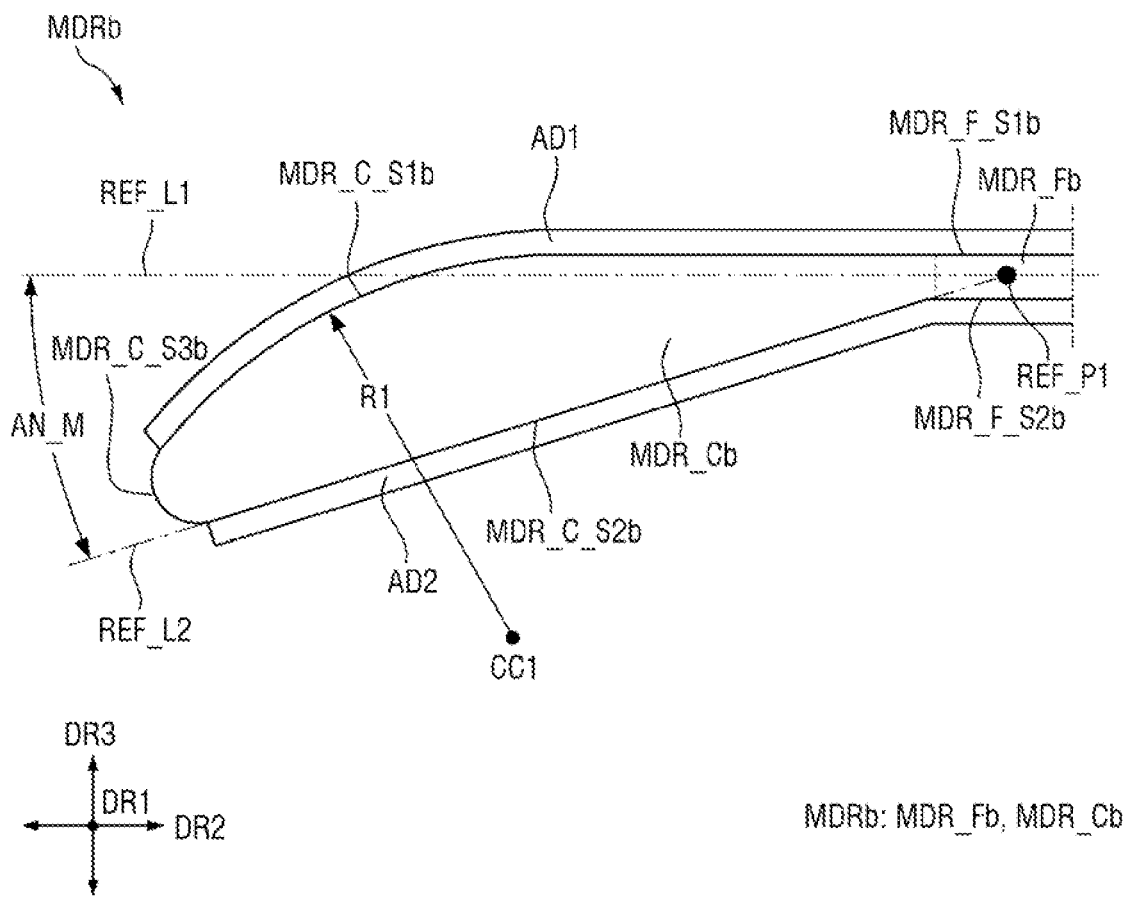
FIG. 10 is a cross-sectional view of a spacer of FIG. 9.

FIG. 9 is a cross-sectional view of a display device according to an embodiment. FIG. 10 is a cross-sectional view of a spacer of FIG. 9.

An embodiment of FIG. 9 differs from embodiments of FIGS. 1 to 6 in that a lower surface MDR_C_S2b of a bent portion MDR_Cb has no curvature.

Referring to FIGS. 9 and 10, in an embodiment, an upper surface MDR_C_S1b of a bent portion MDR_Cb of a spacer MDRb has a first curvature, and a lower surface MDR_C_S2b of the bent portion MDR_Cb has no curvature. The lower surface MDR_C_S2b of the bent portion MDR_Cb is inclined with respect to a lower surface MDR_F_S2b of a flat portion MDR_Fb. As illustrated in FIG. 9, one side of the lower surface MDR_C_S2b of the bent portion MDR_Cb connects to one side of the flat portion MDR_Fb, and the other side of the lower surface MDR_C_S2b of the bent portion MDR_Cb is flat and extends toward a bent region BR.

In an embodiment, the lower surface MDR_C_S2b of the bent portion MDR_Cb forms a predetermined angle AN_M with the flat portion MDR_Fb. The predetermined angle AN_M is measured between a first reference line REF_L1 and a second reference line REF_L2 based on a first reference point REF_P1. The first reference line REF_L1 is a straight line that extends in a second direction DR2 parallel to an upper surface MDR_F_S1b and/or the lower surface MDR_F_S2b of the flat portion MDR_Fb of the spacer MDRb in a cross-sectional view. The first reference line REF_L1 may pass through a center of the flat portion MDR_Fb or bisect the flat portion MDR_Fb. The second reference line REF_L2 is a straight line that extends in a direction parallel to the lower surface MDR_C_S2b of the bent portion MDR_Cb in a cross-sectional view. The first reference point REF_P1 is where the first reference line REF_L1 and the second reference line REF_L2 intersect. The predetermined angle AN_M ranges from about 35° to 45°, and a first radius R1 of curvature ranges from about 3 mm to 5 mm. As another example, the predetermined angle AN_M ranges from about 20° to 30°, and the first radius R1 of curvature ranges from about 4 mm to 6 mm.

In an embodiment, since the lower surface MDR_C_S2b of the bent portion MDR_Cb is flat, at least some of members interposed between the lower surface MDR_C_S2b of the bent portion MDR_Cb and a sub region SR of a display panel 100, such as at least one of a second adhesive layer AD2 and a second support member PF2, are also flat without being curved. Accordingly, in an embodiment of FIG. 9, a lifting phenomenon caused by a repulsive force of the second support member PF2 can be further reduced over that of each of embodiments of FIGS. 1 to 7.

Since an embodiment of FIG. 9 is substantially the same as or similar to that of embodiments of FIGS. 1 to 6 except that the lower surface MDR_C_S2b of the bent portion MDR_Cb has no curvature, redundant descriptions thereof will be omitted.

Figure 11:
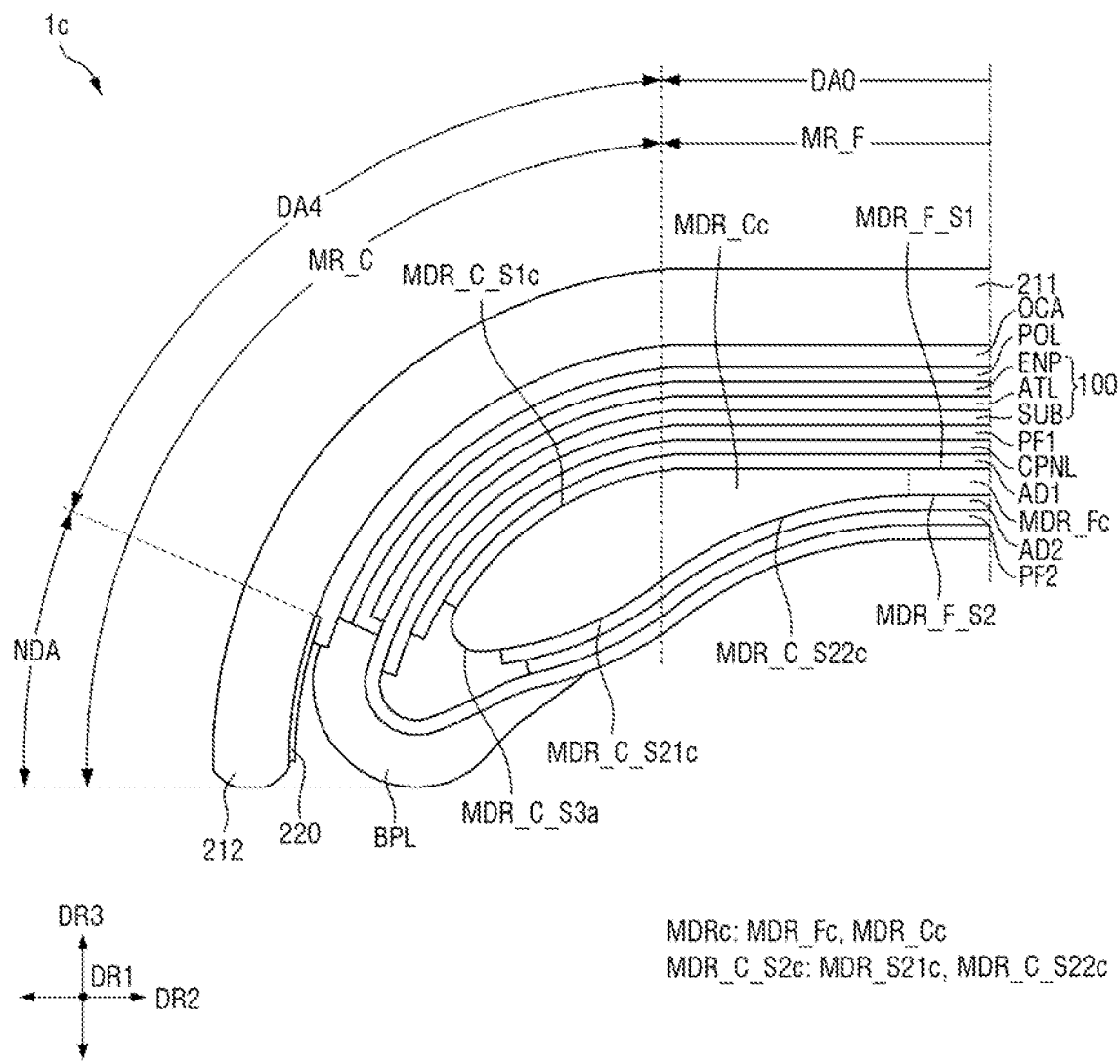
FIG. 11 is a cross-sectional view of a display device according to an embodiment.
Figure 12:
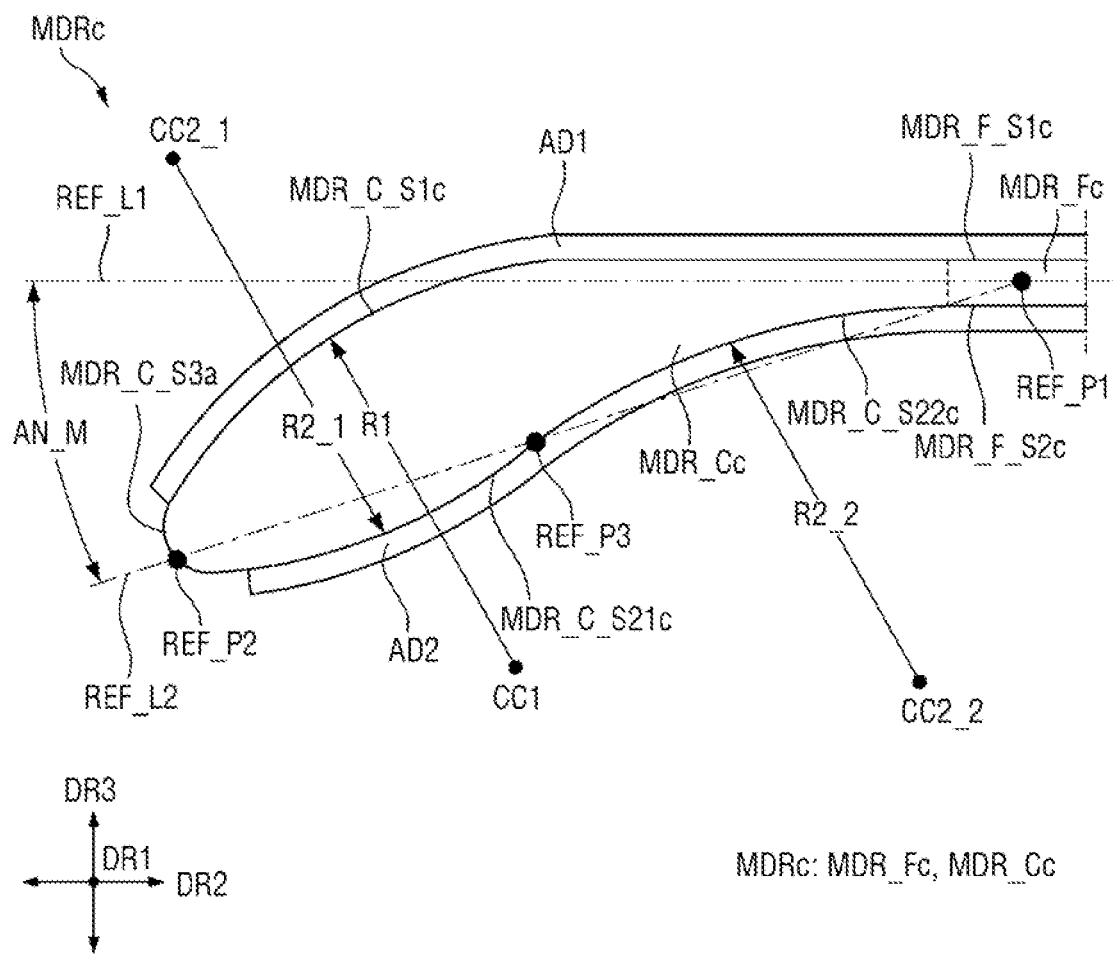
FIG. 12 is a cross-sectional view of a spacer of FIG. 11.

FIG. 11 is a cross-sectional view of a display device according to an embodiment. FIG. 12 is a cross-sectional view of a spacer of FIG. 11.

An embodiment of FIG. 11 differs from embodiments of FIGS. 1 to 6 in that a lower surface MDR_C_S2c of a bent portion MDR_Cc includes two or more curved surfaces.

Referring to FIGS. 11 and 12, in an embodiment, the lower surface MDR_C_S2c of the bent portion MDR_Cc includes a convex surface MDR_C_S21c and a concave surface MDR_C_S22c. However, the number and shape of the curved surfaces included in the lower surface MDR_C_S2c of the bent portion MDR_Cc are not limited thereto. In some embodiments, the lower surface MDR_C_S2c of the bent portion MDR_Cc includes two or more convex surfaces MDR_C_S21c or two or more concave surfaces MDR_C_S22c. In some embodiments, the lower surface MDR_C_S2c of the bent portion MDR_Cc further includes at least one flat surface.

In an embodiment, the convex surface MDR_C_S21c is formed adjacent to an end portion of a spacer MDRc. The convex surface MDR_C_S21c is formed on a fourth sub display region DA4. In some embodiments, a portion of the convex surface MDR_C_S21c extends over a main display region DA0. The convex surface MDR_C_S21c has a shape that protrudes downward in a cross-sectional view. The convex surface MDR_C_S21c is formed between a side surface of the spacer MDR and the concave surface MDR_C_S22c. One side of the convex surface MDR_C_S21c connects to the side surface MDR_C_S3a, and the other side of the convex surface MDR_C_S21c connects to the concave surface MDR_C_S22c.

In an embodiment, the concave surface MDR_C_S22c is closer to a flat portion MDR_Fc of the spacer MDRc than the convex surface MDR_C_S21c. The concave surface MDR_C_S22c is formed in the main display region DA0. In some embodiments, a portion of the concave surface MDR_C_S22c extends over the fourth sub display region DA4. The concave surface MDR_C_S22c has a shape that is recessed upward in a cross-sectional view. The concave surface MDR_C_S22c is formed between the convex surface MDR_C_21c and a lower surface MDR_F_S2c of the flat portion MDR_Fc. One side of the concave surface MDR_C_S22c connects to the other side of the convex surface MDR_C_S21c, and the other side of the concave surface MDR_C_S22c connects to the lower surface MDR_F_S2c of the flat portion MDR_Fc.

In an embodiment, the concave surface MDR_C_S22c and the convex surface MDR_C_S21c have curvatures greater than that of an upper surface of the spacer MDRc. In other words, a radius R2_2 of curvature of the concave surface MDR_C_S22c and a radius R2_1 of curvature of the convex surface MDR_C_S21c are each less than a radius R1 of curvature of the upper surface of the spacer MDRc. In an embodiment, the convex surface MDR_C_S21c has a curvature that is greater than that of the concave surface MDR_C_S22c. In other words, the radius R2_2 of curvature of the concave surface MDR_C_S22c is greater than the radius R2_1 of curvature of the convex surface MDR_C_S21c. For example, the radius R2_2 of curvature of the concave surface MDR_C_S22c ranges from about 1 mm to 6 mm, and the radius R2_1 of curvature of the convex surface MDR_C_S21c ranges from about 0.1 mm to 2 mm. The concave surface MDR_C_S22c and the convex surface MDR_C_S21c each have a curvature that is less than that of a side surface MDR_C_S3a of the spacer MDRc.

In an embodiment, a center CC2_2 of curvature of the concave surface MDR_C_S22c is located below the lower surface of the spacer MDRc in a cross-sectional view. The center CC2_2 of curvature of the concave surface MDR_C_S22c is located below the display panel 100 or the window member 210. A center CC2_1 of curvature of the convex surface MDR_C_21c is located above the lower surface of the spacer MDRc in a cross-sectional. view. The center CC2_1 of curvature of the convex surface MDR_Cc is located above the display panel 100.

In an embodiment, the bent portion MDR_Cc forms a predetermined angle AN_M with the flat portion MDR_Fc. The predetermined angle AN_M is measured between a first reference line REF_L1 and a second reference line REF_L2 based on the first reference point. REF_P1. The first reference line REF_L1 is a straight line parallel to an upper surface MDR_F_S1c or the lower surface MDR_F_S2c of the flat portion MDR_Fc in a cross-sectional view. The first reference line REF_L1 extends in a second direction DR2 and bisects the flat portion MDR_Fc. The second reference line REF_L2 is a straight line that passes through a tip portion of the bent portion MDR_Cc and an inflection point REF_P3 in a cross-sectional view. The inflection point REF_P3 is a boundary between the convex surface MDR_C_21c and the concave surface MDR_C_S22c. In some embodiments, the second reference line REF_L2 is tangent to the inflection point REF_P3. The predetermined angle AN_M ranges from about 15° to 75°.

In an embodiment, since the end portion of the spacer MDRc includes the convex surface MDR_C_S21c, the bent region BR of the display panel 100 and the second support member PF2 have a gentler curvature in the fourth sub display region DA4. Accordingly, the repulsive forces of the display panel 100 and the second support member PF2 can be further reduced.

Since an embodiment of FIG. 11 is substantially the same as or similar to embodiments of FIGS. 1 to 6 except that the lower surface MDR_C_S2c of the bent portion MDR_Cc includes two or more curved surfaces, redundant descriptions thereof will be omitted.

Figure 13:
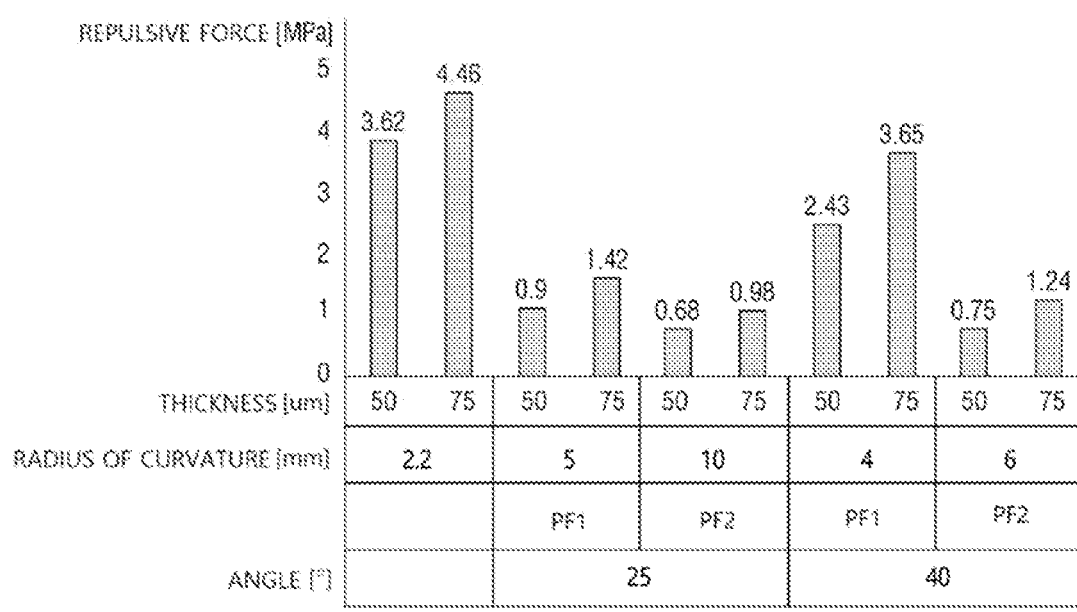
FIG. 13 shows simulation results of testing repulsive forces of a first protective member and a second protective member according to application of a spacer.

FIG. 13 shows results of simulations that test repulsive forces of a first protective member PF1 and a second protective member PF2 according to application of a spacer.

The "thickness," "radius of curvature," and "angle" of a horizontal axis of the graph represent the thicknesses of the first support member PF1 and the second support member PF2, the curvatures of the upper surface MDR_C_S1 and the lower surface MDR_C_S2 of the bent portion MDR_C, and the predetermined angle AN_M between the flat portion MDR_F and the bent portion MDR_C, respectively. A vertical axis of the graph represents the repulsive threes of the first support member PF1 and the second support member PF2. The "thickness" may refer to the thickness of both of the first support member PF1 and the second support member PF2 or may refer to the thickness of any one of the first support member PF1 and the second support member PF2. The curvatures of the upper surface MDR_C_S1 and the lower surface MDR_C_S2 of the bent portion MDR_C are substantially the same as the curvatures of the first support member PF1 and the second support member PF2.

Two bar graphs on a left side of FIG. 13 show the repulsive forces of the first support member PF1 and the second support member PF2 when no spacer MDR is applied. Four bar graphs in a center of FIG. 13 show the repulsive forces of the first support member PF1 and the second support member PF2 when the predetermined angle AN_M is about 25°. Four bar graphs on a right side of FIG. 13 show the repulsive threes of the first support member PF1 and the second support member PF2 when the predetermined angle AN_M is about 40°.

In an embodiment, the repulsive forces of the first support member PF1 and the second support member PF2 decrease as the predetermined angle AN_M between the flat portion MDR_F and the bent portion MDR_C of the spacer MDR decreases, the radius of curvature of the bent portion MDR_C of the spacer MDR increases, and the thicknesses of the first support member PF1 and the second support member PF2 decrease.

Referring to the left side of FIG. 13, when no spacer MDR is provided, the first support member PF1 and the second support member PF2 have a radius of curvature of about 2.2 mm. When the thicknesses of the first support member PF1 and the second support member PF2 are about 50 μm, the repulsive forces of the first support member PF1 and the second support member PF2 are about 3.62 MPa. When the thicknesses of the first support member PF1 and the second support member PF2 are about 75 μm, the repulsive forces of the first support member PF1 and the second support member PF2 are about 4.46. In comparison to the bar graphs in the center and on the right side of FIG. 13, when the spacer MDR is provided, the repulsive forces of the first support member PF1 and the second support member PF2 are reduced.

Referring to the center of FIG. 13, when the predetermined angle AN_M between the flat portion MDR_F and the bent portion MDR_C of the spacer MDR is about 25°, the repulsive forces of the first support member PF1 and the second support member PF2 are reduced the most. For example, when the radii of curvature of the first support member PF1 and the second support member PF2 are about 5 mm and 10 mm, respectively, and the thickness of each of the first support member PF1 and the second support member PF2 is 50 µm, the first support member PF1 and the second support member PF2 have repulsive forces of 0.9 MPa and 0.68 MPa, respectively. As described above, the thicknesses of the first support member PF1 and the second support member PF2 can be appropriately adjusted to prevent the curling of the adjacent members.

Referring to the right side of FIG. 13, when the predetermined angle AN_M between the flat portion MDR_F and the bent portion MDR_C of the spacer MDR is about 40°, the repulsive forces of the first support member PF1 and the second support member PF2 are reduced. For example, when the radii of curvature of the first support member PF1 and the second support member PF2 are about 4 mm and 6 mm, respectively, and the thickness of each of the first support member PF1 and the second support member PF2 is 50 µm, the first support member PF1 and the second support member PF2 have repulsive forces of 2.43 MPa and 0.75 MPa, respectively. When the predetermined angle AN_M between the flat portion MDR_F and the bent portion MDR_C of the spacer MDR is about 40°, the repulsive forces of the first support member PF1 and the second support member PF2 are slightly increased as compared to the repulsive forces when the predetermined angle AN_M between the flat portion MDR_F and the bent portion MDR_C of the spacer MDR is about 25°, but an internal space of the display device 1 is saved.

In display devices according to embodiments, a lifting phenomenon between members can be minimized and an internal space of the display device can be efficiently utilized.

Effects of exemplary embodiments of the present disclosure are not limited by the content described above, and more various effects are included in the specification.

In concluding the detailed description, those skilled in the art will appreciate that many variations and modifications can be made to embodiments without substantially departing from the principles of the present disclosure. Therefore, disclosed embodiments of the disclosure are used in a generic and descriptive sense only and not for purposes of limitation.

What is claimed is:

1. A display device, comprising:
a display panel that is bent wherein at least a portion of the display panel overlaps another portion of the display panel; and
a spacer surrounded by the display panel and that includes a flat portion and a bent portion connected to the flat portion,
wherein an upper surface of the bent portion is curved with a first curvature forming a curved upper surface and a lower surface of the bent portion is curved with a second curvature that differs from the first curvature, forming a curved lower surface, wherein the curved upper surface overlaps the curved lower surface in a thickness direction of the spacer,
wherein the display device further comprises:
a first adhesive layer disposed on an upper surface of the spacer; and
a second adhesive layer disposed on a lower surface of the spacer,
wherein the first adhesive layer and the second adhesive layer have different thicknesses.

2. The display device of claim 1,
wherein the display panel includes a main region, a bent region that extends from one side of the main region and is bent in a thickness direction, and a sub region which extends from one side of the bent region,
wherein the main region includes a flat region and a curved region that extends from one side of the flat region, and
wherein the flat portion of the spacer overlaps the flat region of the main region, and the bent portion of the spacer overlaps the curved region of the main region.

3. The display device of claim 2,
wherein the sub region is inverted with respect to the bent region and is attached onto a rear surface of the main region, and
the sub region includes a flat region that overlaps the flat region of the main region and a curved region that extends from the flat region of the sub region and overlaps the curved region of the main region,
wherein the flat portion of the spacer is disposed between the flat region of the main region and the flat region of the sub region, and the bent portion of the spacer is disposed between the curved region of the main region and the curved region of the sub region.

4. The display device of claim 3, wherein a curvature of the curved region of the main region is greater than a curvature of the curved region of the sub region.

5. The display device of claim 2, wherein the bent portion of the spacer includes an upper surface that faces the main region and a lower surface that faces the sub region.

6. The display device of claim 5, wherein a first curvature of the upper surface of the bent portion of the spacer is greater than a second curvature of the lower surface of the bent portion of the spacer.

7. The display device of claim 6, further comprising a window member that covers the display panel and that includes a flat region and a curved region connected to the flat region,
wherein a center of curvature of the first curvature of the upper surface of the bent portion of the spacer is the same as that of a curvature of the curved region of the window member.

8. The display device of claim 6, wherein a radius of curvature of the second curvature ranges from 1.5 times to 2 times a radius of curvature of the first curvature.

9. The display device of claim 1, wherein a thickness of the bent portion of the spacer is greater than or equal to a thickness of the flat portion of the spacer.

10. The display device of claim 9, wherein the thickness of the bent portion of the spacer increases in a direction away from a side of the bent portion connected to the flat portion of the spacer and toward an end portion of the spacer.

11. The display device of claim 1, wherein the bent portion of the spacer forms a predetermined angle with the flat portion of the spacer.

12. The display device of claim 11, wherein the predetermined angle ranges from about 20° to 45°.

13. The display device of claim 1, wherein
an end portion of the bent portion of the spacer is surrounded by a bent region of the display panel, and
the end portion of the bent portion is spaced apart from the bent region of the display panel.

14. The display device of claim 1, further comprising:
a first support member attached onto the first adhesive layer; and
a second support member attached onto the second adhesive layer.

15. The display device of claim 14, wherein the first support member and the second support member have different thicknesses.

16. The display device of claim 15, wherein a thickness of the first support member is greater than a thickness of the second support member.

17. The display device of claim 14, wherein the first support member and the second support member each include polyethylene terephthalate.

18. The display device of claim 14, wherein the first support member and the second support member each have a repulsive force of 3.65 MPa or less.

19. The display device of claim 1, wherein each of a flat region and a curved region of a main region of the display panel includes a display region in which an image is displayed.

20. A display device, comprising:
a driving substrate;
a display panel that is bent wherein a portion of one side of the display panel to which the driving substrate is attached overlaps another portion of the display panel;
a window member that covers the display panel and that includes a flat region and a curved region connected to the flat region; and
a spacer that is surrounded by the display panel and is bent so that at least a portion has a curvature that corresponds to a curvature of the curved region of the window member,
wherein an upper surface of the bent portion is curved with a first curvature forming a curved upper surface and a lower surface of the bent portion is curved with a second curvature that differs from the first curvature, forming a curved lower surface, wherein the curved upper surface overlaps the curved lower surface in a thickness direction of the spacer,
wherein the display device further comprises:
a first adhesive layer disposed on an upper surface of the spacer; and
a second adhesive layer disposed on an lower surface of the spacer,
wherein the first adhesive layer and the second adhesive layer have different thicknesses.

21. The display device of claim 20, wherein the spacer includes a flat portion that overlaps the flat region of window member and a bent portion that overlaps the curved region of the window member.

22. The display device of claim 20, further comprising:
a first support member attached onto the first adhesive layer; and
a second support member attached onto the second adhesive layer.

23. A display device, comprising:
a display panel that includes a main region, a bent region that extends from one side of the main region and is bent in a thickness direction, and a sub region which extends from one side of the bent region, wherein the main region includes a flat region and a curved region that extends from one side of the flat region; and
a spacer that is surrounded by the display panel and is bent so that at least a portion has a curvature that corresponds to a curvature of the curved region of the main region of the display panel,
wherein an upper surface of the bent portion is curved with a first curvature forming a curved upper surface and a lower surface of the bent portion is curved with a second curvature that differs from the first curvature, forming a curved lower surface, wherein the curved upper surface overlaps the curved lower surface in a thickness direction of the spacer,
wherein the display device further comprises:
a first adhesive layer disposed on an upper surface of the spacer; and
a second adhesive layer disposed on an lower surface of the spacer,
wherein the first adhesive layer and the second adhesive layer have different thicknesses.

24. The display device of claim 23, wherein the spacer includes a flat portion and a bent portion connected to the flat portion, wherein the flat portion of the spacer overlaps the flat region of the main region, the bent portion of the spacer overlaps the curved region of the main region, and an end portion of the bent portion of the spacer is surrounded by the bent region of the display panel, and the end portion of the bent portion is spaced apart from the bent region of the display panel.

* * * * *